US 10,608,463 B1
Mar. 31, 2020

(12) United States Patent
Aronov et al.

(54) DIRECT CHARGING OF BATTERY CELL STACKS

(71) Applicant: StoreDot Ltd., Herzeliya (IL)

(72) Inventors: Daniel Aronov, Netanya (IL); Avraham Edelshtein, Herzelia (IL); Maxim Liberman, Haifa (IL)

(73) Assignee: Storedot Ltd., Herzeliya (IL)

(*) Notice: Subject to any disclaimer, the term of this patent is extended or adjusted under 35 U.S.C. 154(b) by 0 days.

(21) Appl. No.: 16/254,648

(22) Filed: Jan. 23, 2019

(51) Int. Cl.
| | |
|---|---|
| *H02J 7/04* | (2006.01) |
| *H02J 7/00* | (2006.01) |
| *G01R 31/3842* | (2019.01) |
| *H01M 10/44* | (2006.01) |
| *H01M 10/42* | (2006.01) |
| *G01R 31/392* | (2019.01) |

(52) U.S. Cl.
CPC .......... *H02J 7/045* (2013.01); *G01R 31/3842* (2019.01); *H01M 10/425* (2013.01); *H01M 10/441* (2013.01); *H02J 7/0014* (2013.01); *G01R 31/392* (2019.01); *H01M 2010/4271* (2013.01)

(58) Field of Classification Search
CPC . H02J 7/045; H02J 7/0068; H01M 2010/4271
USPC ........................................................ 320/132
See application file for complete search history.

(56) References Cited

U.S. PATENT DOCUMENTS

| | | | |
|---|---|---|---|
| 3,778,254 A | 12/1973 | Cole et al. | |
| 6,051,340 A | 4/2000 | Kawakami | |
| 6,492,061 B1 | 12/2002 | Gauthier et al. | |
| 6,541,156 B1 | 4/2003 | Fuse et al. | |
| 6,558,438 B1 | 5/2003 | Satoh | |
| 6,599,662 B1 | 7/2003 | Chiang et al. | |
| 7,192,673 B1 | 3/2007 | Ikeda et al. | |

(Continued)

FOREIGN PATENT DOCUMENTS

| | | |
|---|---|---|
| CA | 2161076 | 4/1996 |
| CA | 2258026 | 12/1997 |

(Continued)

OTHER PUBLICATIONS

U.S. Appl. No. 16/243,190, filed Jan. 9, 2019, Kuks et al.

(Continued)

*Primary Examiner* — Robert Grant
*Assistant Examiner* — Harry O'Neill-Becerril
(74) *Attorney, Agent, or Firm* — Pearl Cohen Zedek Latzer Baratz LLP

(57) ABSTRACT

Charging methods and systems are provided which charge multiple cells directly from an AC source, by adjusting, momentarily, the number of charged cells to the momentary voltage level provided by the AC source. Cells are rapidly switched in and out to correspond to the provided voltage level, and the charging level of each cell is regulated by the switching order of the cells—determined according to cell characteristics such as state of charge and state of health. Advantageously, charging losses are reduced significantly in the disclosed systems and methods, and an additional level of cell control is provided. The charged assembly of cells may be arranged and re-arranged in various configurations to optimize the charging scheme, e.g., to equalize the charging states of the cells to simplify the use and improve the efficiency of the cell stack.

24 Claims, 17 Drawing Sheets

(56) References Cited

U.S. PATENT DOCUMENTS

| | | |
|---|---|---|
| 7,656,120 B2 | 2/2010 | Neu et al. |
| 7,906,238 B2 | 3/2011 | Le |
| 7,956,576 B2 | 6/2011 | Neu et al. |
| 8,021,791 B1 | 9/2011 | Plichta et al. |
| 8,945,774 B2 | 2/2015 | Coowar et al. |
| 8,951,673 B2 | 2/2015 | Wessells et al. |
| 9,406,927 B1 | 8/2016 | Burshtain et al. |
| 9,472,804 B2 | 10/2016 | Burshtain et al. |
| 9,583,761 B2 | 2/2017 | Burshtain et al. |
| 9,728,776 B2 | 8/2017 | Burshtain et al. |
| 9,871,247 B2 | 1/2018 | Burshtain et al. |
| 10,096,859 B2 | 10/2018 | Burshtain et al. |
| 10,110,036 B2 | 10/2018 | Aronov |
| 10,199,677 B2 | 2/2019 | Drach et al. |
| 2001/0017531 A1 | 8/2001 | Sakakibara et al. |
| 2002/0122980 A1 | 9/2002 | Fleischer et al. |
| 2002/0146623 A1 | 10/2002 | Suzuki et al. |
| 2003/0039889 A1 | 2/2003 | Park et al. |
| 2004/0033360 A1 | 2/2004 | Armand et al. |
| 2004/0219428 A1 | 11/2004 | Nagayama |
| 2005/0019659 A1 | 1/2005 | Shiozaki et al. |
| 2005/0093512 A1 | 5/2005 | Mader et al. |
| 2007/0003837 A1 | 1/2007 | Nishimura et al. |
| 2007/0281216 A1 | 12/2007 | Petrat et al. |
| 2007/0284159 A1 | 12/2007 | Takami et al. |
| 2008/0093143 A1 | 4/2008 | Harrison |
| 2008/0248386 A1 | 10/2008 | Obrovac et al. |
| 2009/0111020 A1 | 4/2009 | Yamaguchi et al. |
| 2009/0179181 A1 | 7/2009 | Zhang et al. |
| 2009/0317637 A1 | 12/2009 | Luhrs et al. |
| 2010/0134065 A1 | 6/2010 | Iida |
| 2010/0134305 A1 | 6/2010 | Lu et al. |
| 2010/0159331 A1 | 6/2010 | Lee et al. |
| 2010/0190059 A1 | 7/2010 | Graetz et al. |
| 2011/0123870 A1 | 5/2011 | Oh et al. |
| 2011/0181245 A1* | 7/2011 | Wey ............ H02J 7/0016 320/118 |
| 2011/0198936 A1* | 8/2011 | Graovac ............ H02M 7/79 307/82 |
| 2011/0257001 A1 | 10/2011 | Negishi |
| 2011/0260689 A1 | 10/2011 | Kano |
| 2012/0045696 A1 | 2/2012 | Herle |
| 2012/0088155 A1 | 4/2012 | Yushin et al. |
| 2012/0164531 A1 | 6/2012 | Chen et al. |
| 2013/0040226 A1 | 2/2013 | Yamauchi et al. |
| 2013/0059174 A1 | 3/2013 | Zhamu |
| 2013/0224594 A1 | 8/2013 | Yushin et al. |
| 2013/0229153 A1 | 9/2013 | Sarkar et al. |
| 2013/0260285 A1 | 10/2013 | Yamauchi et al. |
| 2013/0266875 A1 | 10/2013 | Matsumoto et al. |
| 2014/0004426 A1 | 1/2014 | Kerlau et al. |
| 2014/0113202 A1 | 4/2014 | Sun et al. |
| 2014/0295267 A1 | 10/2014 | Wang |
| 2015/0017515 A1 | 1/2015 | Jeon et al. |
| 2015/0046110 A1 | 2/2015 | Joe et al. |
| 2015/0221977 A1 | 8/2015 | Hallac et al. |
| 2015/0367747 A1 | 12/2015 | Decker et al. |
| 2016/0036045 A1 | 2/2016 | Burshtain et al. |
| 2016/0064773 A1 | 3/2016 | Choi et al. |
| 2016/0104882 A1 | 4/2016 | Yushin et al. |
| 2016/0149220 A1 | 5/2016 | Uhm et al. |
| 2016/0264124 A1 | 9/2016 | Hotta |
| 2016/0372753 A1 | 12/2016 | Fukasawa et al. |
| 2017/0012279 A1 | 1/2017 | Burshtain et al. |
| 2017/0207451 A1 | 7/2017 | Burshtain et al. |
| 2017/0294643 A1 | 10/2017 | Burshtain et al. |
| 2017/0294644 A1 | 10/2017 | Burshtain et al. |
| 2017/0294648 A1 | 10/2017 | Burshtain et al. |
| 2017/0294649 A1 | 10/2017 | Burshtain et al. |
| 2017/0294680 A1 | 10/2017 | Burshtain et al. |
| 2017/0294687 A1 | 10/2017 | Burshtain et al. |
| 2017/0373513 A1 | 12/2017 | Aronov et al. |
| 2018/0050602 A1 | 2/2018 | Aronov |
| 2018/0212236 A1 | 7/2018 | Jacob et al. |
| 2018/0212239 A1 | 7/2018 | Jacob et al. |
| 2018/0212240 A1 | 7/2018 | Jacob et al. |
| 2018/0212439 A1 | 7/2018 | Aronov |
| 2018/0301757 A1 | 10/2018 | Burshtain et al. |
| 2018/0315990 A1 | 11/2018 | Paz et al. |

FOREIGN PATENT DOCUMENTS

| | | |
|---|---|---|
| CN | 101734675 | 6/2010 |
| CN | 104577081 | 4/2015 |
| EP | 1999818 | 12/2008 |
| EP | 2889097 | 7/2015 |
| JP | 2002-056891 | 2/2002 |
| JP | 2006-216276 | 8/2006 |
| JP | 2007-323837 | 12/2007 |
| JP | 2008-053092 | 3/2008 |
| JP | 2012/131674 | 7/2012 |
| JP | 2014-002834 | 1/2014 |
| KR | 2012-121265 | 10/2012 |
| KR | 2015-0015070 | 2/2015 |
| WO | WO 2013/040356 | 3/2013 |
| WO | WO 2014068036 | 5/2014 |
| WO | WO 2015/145521 | 10/2015 |
| WO | WO 2016/031082 | 3/2016 |
| WO | WO 2018/109774 | 6/2018 |

OTHER PUBLICATIONS

Chaudhuri et al. "Core/shell nanoparticles: classes, properties, synthesis mechanisms, characterization, and applications" Chemical Reviews, vol. 112, No. 4, pp. 2373-2433, 2012.

Wu et al. "Hydrogen Storage in Pillared Li-Dispersed Boron Carbide Nanotubes", J. Phys. Chem. C, 2008, vol. 112, No. 22, pp. 8458-8463.

Secrist "Compound Formation in the Systems Lithium-Carbon and Lithium-Boron", Journal of the American Ceramic Society, Oct. 1967, vol. 50, No. 10, pp. 520-523.

Suzuki et al. "Silicon nitride thin film electrode for lithium-ion batteries", Journal of Power Sources, 2013, vol. 231, pp. 186-189.

Konno et al. "Application of Si—C—O glass-like compounds as negative electrode materials for lithium hybrid capacitors", Journal of Power Sources, 2009, vol. 191, No. 2, pp. 623-627.

Hu et al. "Silicon/graphene based nanocomposite anode: large-scale production and stable high capacity for lithium ion batteries", Journal of Materials Chemistry A, 2014, vol. 2, No. 24, pp. 9118-9125.

Cui et al. "Carbon-Silicon Core-Shell Nanowires as High Capacity Electrode for Lithium Ion Batteries", Nano Letters, May 8, 2009, vol. 9, No. 9, pp. 3370-3374.

Kennedy et al. "High-Performance Germanium Nanowire-Based Lithium-Ion Battery Anodes Extending over 1000 Cycles Through in Situ Formation of a Continuous Porous Network", Nano Letters, 2014, vol. 14, pp. 716-723.

Hwang et al. "Mesoporous Ge/GeO2/Carbon Lithium-Ion Battery Anodes with High Capacity and High Reversibility", ACS Nano, Apr. 13, 2015, vol. 9, No. 5, pp. 5299-5309.

Balomenos et al. "Exergy Analysis of Metal Oxide Carbothemic Reduction under Vacuum—Sustainability prospects", International Journal of Thermodynamics, Jun. 4, 2012, vol. 15, No. 3, pp. 141-148.

Barton et al. "The Reduction of Germanium Dioxide With Graphite At High Temperatures", Journal of the Less-Common Metals, 1970, vol. 22, pp. 11-17.

Nitta et al. "High-Capacity Anode Materials for Lithium-Ion Batteries: Choice of Elements and Structures for Active Particles", Particle Systems Characterization, 2014, vol. 31, pp. 317-336.

Chung et al. "Electronically conductive phospho-olivines as lithium storage electrodes", nature materials, Oct. 22, 2002, vol. 1, pp. 123-128.

Kennedy et al. "Nanowire Heterostructures Comprising Germanium Stems and Silicon Branches as High-Capacity Li-Ion Anodes with Tunable Rate Capability", ACS Nano, Jun. 30, 2015, vol. 9, No. 7, pp. 7456-7465.

(56) References Cited

OTHER PUBLICATIONS

Kyotani et al. "Remarkable performance improvement of inexpensive ball-milled Si nanoparticles by carbon-coating for Li-ion batteries", Journal of Power Sources, Jul. 1, 2016, vol. 319, pp. 99-103.
Son et al. "Silicon carbide-free graphene growth on silicon for lithium-ion battery with high volumetric energy density", Nature Communications, Jun. 25, 2015, vol. 6, No. 7393, pp. 1-8.
Tow et al. "A Study of Highly Oriented Pyrolytic Graphite as a Model for the Graphite Anode in Li-Ion Batteries", Journal of the Electrochemical Society, 1999, vol. 146, No. 3, pp. 824-832.
Qi et al. "Threefold Increase in the Young's Modulus of Graphite Negative Electrode during Lithium Intercalation", Journal of the Electrochemical Society, 2010, vol. 157, No. 5, pp. A558-A566.
Qi et al. "Lithium Concentration Dependent Elastic Properties of Battery Electrode Materials from First Principles Calculations", Journal of the Electrochemical Society, 2014, vol. 161, No. 11, pp. F3010-F3018.
Wen et al. "Thermodynamic and Mass Transport Properties of "LiAl"", Solid-State Science and Technology, Dec. 1979, vol. 126, No. 12, pp. 2258-2266.
Wu et al. "Stable Li-ion battery anodes by in-situ polymerization of conducting hydrogel to conformally coat silicon nanoparticles", Nature Communications, Jun. 4, 2013, vol. 4, No. 1943, pp. 1-6.
Sun et al. "Silicon/Wolfram Carbide@Graphene composite: enhancing conductivity and structure stability in amorphous-silicon for high lithium storage performance", Electrochimica Acta, Jun. 25, 2016, vol. 191, pp. 462-472.
Cho et al. "Zero-Strain Intercalation Cathode for Rechargeable Li-Ion Cell", Angewandte Chemie, 2001, vol. 40, No. 18, pp. 3367-3369.
Ngo et al. "Mass-scalable synthesis of 3D porous germanium-carbon composite particles as an ultra-high rate anode for lithium ion batteries", Energy & Environmental Science, 2015, vol. 8, pp. 3577-3588.
Billaud et al. "Synthesis and electrical resistivity of lithium-pyrographite intercalation compounds (stages I, II and III)", Materials Research Bulletin, Jul. 1979, vol. 14, No. 7, pp. 857-864.
Guriparti et al. "Review on recent progress of nanostructured anode materials for Li-ion batteries", Journal of Power Sources, 2014, vol. 257, pp. 421-443.
Scott et al. "Ultrathin Coatings on Nano-LiCoO2 for Li-Ion Vehicular Applications", Nano Letters, 2011, vol. 11, pp. 414-418.
Chen et al. "Conductive Rigid Skeleton Supported Silicon as High-Performance Li-Ion Battery Anodes", Nano Letters, 2012, vol. 12, pp. 4124-4130.
Kim et al. "Electrochemical properties of carbon-coated Si/B composite anode for lithium ion batteries", Journal of Power Sources, 2009, vol. 189, pp. 108-113.
Wang et al. "Boron-doped carbon nanotube-supported Pt nanoparticles with improved CO tolerance for methanol electro-oxidation", Phys. Chem. Chem. Phys., 2012, vol. 14, pp. 13910-13913.
Wang et al. "The dimensionality of Sn anodes in Li-ion batteries", materialstoday, Dec. 2012, vol. 15, No. 12, pp. 544-552.
Bhandavat et al. "Improved Electrochemical Capacity of Precursor-Derived Si(B)CN-Carbon Nanotube Composite as Li-Ion Battery Anode", ACS Applied Materials & Interfaces, Oct. 2, 2012, vol. 4, pp. 5092-5097.
Bhandavat et al. "Synthesis, Characterization, and High Temperature Stability of Si(B) CN-Coated Carbon Nanotubes Using a Boron-Modified Poly(ureamethylvinyl)Silazane Chemistry", Journal of the American Ceramic Society, 2012, vol. 95, No. 5, pp. 1536-1543.
Nowotny et al. "Investigations in the three systems: Molybdenum-Silicon-boron, tungsten-Silicon-boron and in which System: VS12—TaSi2", MB. Chem., 1956, vol. 88, No. 2, pp. 179-182.
Kasavajjula et al. "Nano- and bulk-silicon-based insertion anodes for lithium-ion secondary cells", Journal of Power Sources, 2007, Vo. 163, pp. 1003-1039.

Yom et al. "Improved electrochemical behavior of Tungsten Coated Silicon Monoxide-Carbon composite anode in lithium ion battery",Abstract #1041, The Electrochemical Society 224th ECS Meeting, Oct. 27-Nov. 1, 2013.
Liu et al. "A pomegranate-inspired nanoscale design for large-volume-change lithium battery anodes", Nature Nanotechnology, Mar. 2014, vol. 9, pp. 187-192.
Tao et al. "Hollow core-shell structured Si/C nanocomposites as high-performance anode materials for lithium-ion batteries", Nanoscale, 2014, vol. 6, pp. 3138-3142.
Song et al. "Is Li4Ti5O12 a solid-electrolyte-interphase-free electrode material in Li-ion batteries? Reactivity between the Li4Ti5O12 electrode and electrolyte", Journal of Materials Chemistry A, 2014, vol. 2, pp. 631-636.
Byeon "Multifunctional metal-polymer nanoagglomerates from singlepass aerosol self-assembly", Scientific Reports, Aug. 10, 2016, pp. 1-8.
Dhawan et al. "Development of Highly Hydrophobic and Anticorrosive Conducting Polymer Composite Coating for Corrosion Protection in Marine Environment", American Journal of Polymer Science, 2015, vol. 5, No. 1A, pp. 7-17.
Skameche et al. "Electrodeposition, electrochemical and optical properties of poly(3-cylopropylmethylpyrrole), a new, hydrophobic, conducting polymer film", American Institute of Physics, 1996, vol. 354, No. 75, pp. 75-81.
Zhao et al. "Artificial Solid Electrolyte Interphase-Protected LixSi Nanoparticles: An Efficient and Stable Prelithiation Reagent for Lithium-Ion Batteries", Journal of the American Chemical Society, Jun. 19, 2015, vol. 137, No. 75, pp. 8372-8375.
Gay et al. "Performance Characteristics of Solid Lithium-Aluminium Alloy Electrodes", Journal of the Electrochemical Society, Nov. 1976, vol. 123, No. 11, pp. 1591-1596.
Li et al. "High-rate aluminium yolk-shell nanoparticle anode for Li-ion battery with long cycle life and ultrahigh capacity" Nature Communications, Aug. 5, 2015, pp. 1-7.
Maoz et al. "Site-Targeted Interfacial Solid-Phase Chemistry: Surface Functionalization of Organic Monolayers via Chemical Transformations Locally Induced at the Boundary between Two Solids", Angewandte Chemie, 2016, vol. 55, pp. 12366-12371.
Molino et al. "Hydrophobic conducting polymer films from post deposition thiol exposure", Synthetic Metals 162, 2012, pp. 1464-1470.
Jankovski et al. "New boron based salts for lithium-ion batteries using conjugated ligands", Physical Chemistry Chemical Physics, May 19, 2016, vol. 18, pp. 16274-16280.
Aurbach et al. "A short review of failure mechanisms of lithium metal and lithiated graphite anodes in liquid electrolyte solutions", Solid State Ionics, 2002, vol. 148, pp. 405-416.
He et al. "Effect of solid electrolyte interface (SEI) film on cyclic performance of Li4Ti5O12 anodes for Li ion batteries", Journal of Power Sources, 2013, vol. 239, pp. 269-276.
He et al. "Gassing in Li4Ti5O12-based batteries and its remedy", Scientific Reports, Dec. 3, 2012, vol. 2, No. 913, pp. 1-9.
Scharner et al. "Evidence of Two-Phase Formation upon Lithium Insertion into the Li1.33Ti1.67O4 Spinel", Journal of the Electrochemical Society, 1999, vol. 146, No. 3, pp. 857-861.
Doughty et al. "A General Discussion of Li Ion Battery Safety", The Electrochemical Society Interface, 2012, pp. 37-44.
E. McRae and J.F. Mareche "Stage dependence of the electrical resistivity of graphite intercalation compounds" Journal of Physics C; Solid State Physics, vol. 18, No. 8, Apr. 5, 1983, pp. 1627-1640, Lab. de Chimie du Solide Miner., Nancy Univ., Vandoeuvre, France.
Takatoshi Kasukabe et al. "Beads-Milling of Waste Si Sawdust into High-Performance Nanoflakes for Lithium-Ion Batteries" Sci Rep. 2017; 7: 42734. Published online Feb. 20, 2017.
Yongxin An et al. "Effects of VC-LiBOB binary additives on SEI formation in ionic liquid-organic composite electrolyte" RSC Advances, 2012, 2, Accepted Feb. 21, 2012, pp. 4097-4102.
Aaron M. Chockla "Tin-Seeded Silicon Nanowires for High Capacity Li-Ion Batteries" Department of Chemical Engineering, Texas Materials Institute, Center for Nano- and Molecular Science and Technology,The University of Texas at Austin, Austin, Texas 78712-1062, United States, pp. 3738-3745, Published: Sep. 11, 2012.

(56) References Cited

OTHER PUBLICATIONS

Yong-Mao Lin et al. "High performance silicon nanoparticle anode in fluoroethylene carbonate-based electrolyte for Li-ion batteriesw" Chem. Commun., 2012, 48, Accepted May 28, 2012, pp. 7268-7270.
Rosa Martel Danoary Tsirinomeny "Contribution to the Ultra-Fast Charging of Electric Vehicles: The Configurable Modular Multi-level Converter (CMMC)" Mots-clés de l'auteur: Ultra-fast; lithium-titanate; UFCEV; CMMC; Flex-EV. Mar. 4, 2016.
Xu et al. "Reversible Conversion of Conducting Polymer Films from Superhydrophobic to Superhydrophilic", Angewandte Chemie, 2005, vol. 44, pp. 6009-6012.
Aldrich (Sigma-Aldrich MSDS Lithium hexafluorophosphate {http://www.sigmaaldrich.com/MSDS/MSDS/DisplayMSDSPage.do?country=US&language=en&productNumber=450227&brand=ALDRICH} Printed Dec. 19, 2017).
Millipore (MSDS 1-Butyl-1-methylpyrrolidinium bis(trifluoromethylsulfonyl)imide high purity {http://www.emdmillipore.com/Web-US-Site/en_CA/-/USD/ProcessMSDS-Start?PlainSKU=MDA_CHEM-492046&Origin=PDF} date Nov. 4, 2014).
M. Moreno et al. "Ionic Liquid Electrolytes for Safer Lithium Batteries" Journal of the Electrochemical Society, 164 (1) A6026-A6031 (2017), pp. 6026-6031.
Andrzej Lewandowski et al. "Ionic liquids as electrolytes for Li-ion batteries—An overview of electrochemical studies" Journal of Power Sources 194 (2009) pp. 601-609.
Marisa C. Buzzeo et al. "Non-Haloaluminate Room-Temperature Ionic Liquids in Electrochemistry—A Review" ChemPhysChem 2004, 5, pp. 1106-1120.
International Search Report and Written Opinion of PCT Application No. PCT/IL2017/050424, dated Jul. 13, 2017.
Office action of U.S. Appl. No. 15/414,655 dated Aug. 14, 2017.
Office action of U.S. Appl. No. 15/447,784 dated Jun. 22, 2017.
Office action of U.S. Appl. No. 15/447,889 dated Jul. 17, 2017.
Office action of U.S. Appl. No. 15/480,919 dated Jul. 5, 2017.
Office action of U.S. Appl. No. 15/414,655, dated May 9, 2017.
Office action of U.S. Appl. No. 15/287,292, dated Dec. 15, 2017.
Office action of U.S. Appl. No. 15/447,784, dated Dec. 28, 2017.
Office Action for U.S. Appl. No. 15/480,888, dated Oct. 1, 2018.
Office Action for U.S. Appl. No. 15/853,885, dated Feb. 23, 2018.
Office action of U.S. Appl. No. 15/480,888 dated Sep. 13, 2017.
Office action of U.S. Appl. No. 15/447,784 dated Oct. 19, 2017.
Office action of U.S. Appl. No. 15/582,066 dated Aug. 21, 2017.
Office Action for U.S. Appl. No. 15/783,586, dated Apr. 6, 2018.
European Search Report for Application No. EP17206661.5, dated Apr. 16, 2018.
Office Action for U.S. Appl. No. 15/447,889, dated May 24, 2018.
Office Action for U.S. Appl. No. 15/480,904, dated Oct. 29, 2018.
Office Action for U.S. Appl. No. 15/480,911, dated Nov. 8, 2018.
Office Action for U.S. Appl. No. 15/480,922, dated Nov. 8, 2018.
Office Action for U.S. Appl. No. 15/844,689, dated Jan. 31, 2018.
Office Action for U.S. Appl. No. 15/844,689, dated Apr. 16, 2018.
Office Action for U.S. Appl. No. 15/844,689, dated May 23, 2018.
Notice of Allowance for U.S. Appl. No. 15/844,689, dated Sep. 4, 2018.
Office Action for U.S. Appl. No. 16/254,644, dated Mar. 1, 2019.
Notice of Allowance for U.S. Appl. No. 16/258,728, dated Mar. 6, 2019.

\* cited by examiner

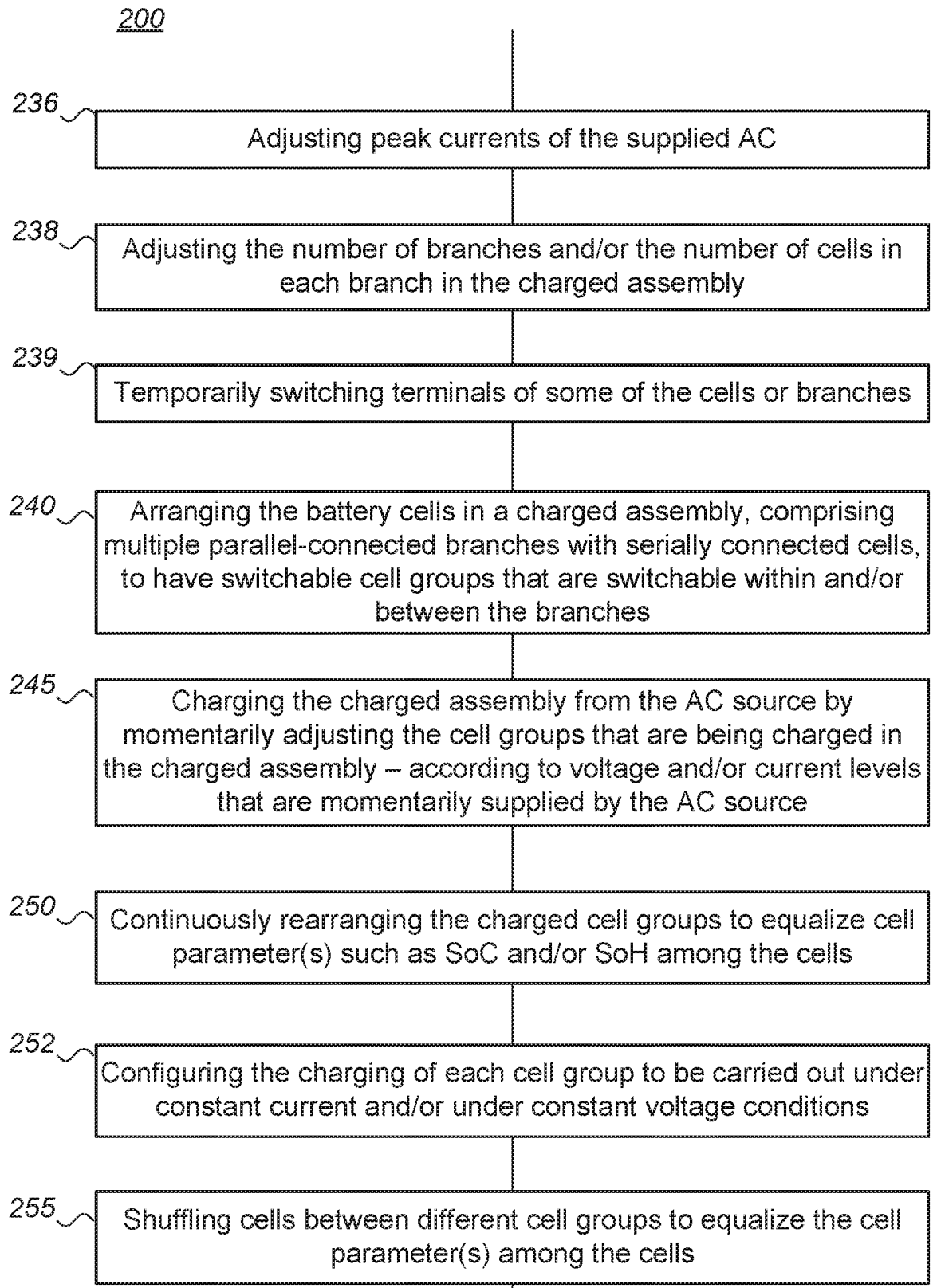
Figure 9 (continued, 1.)

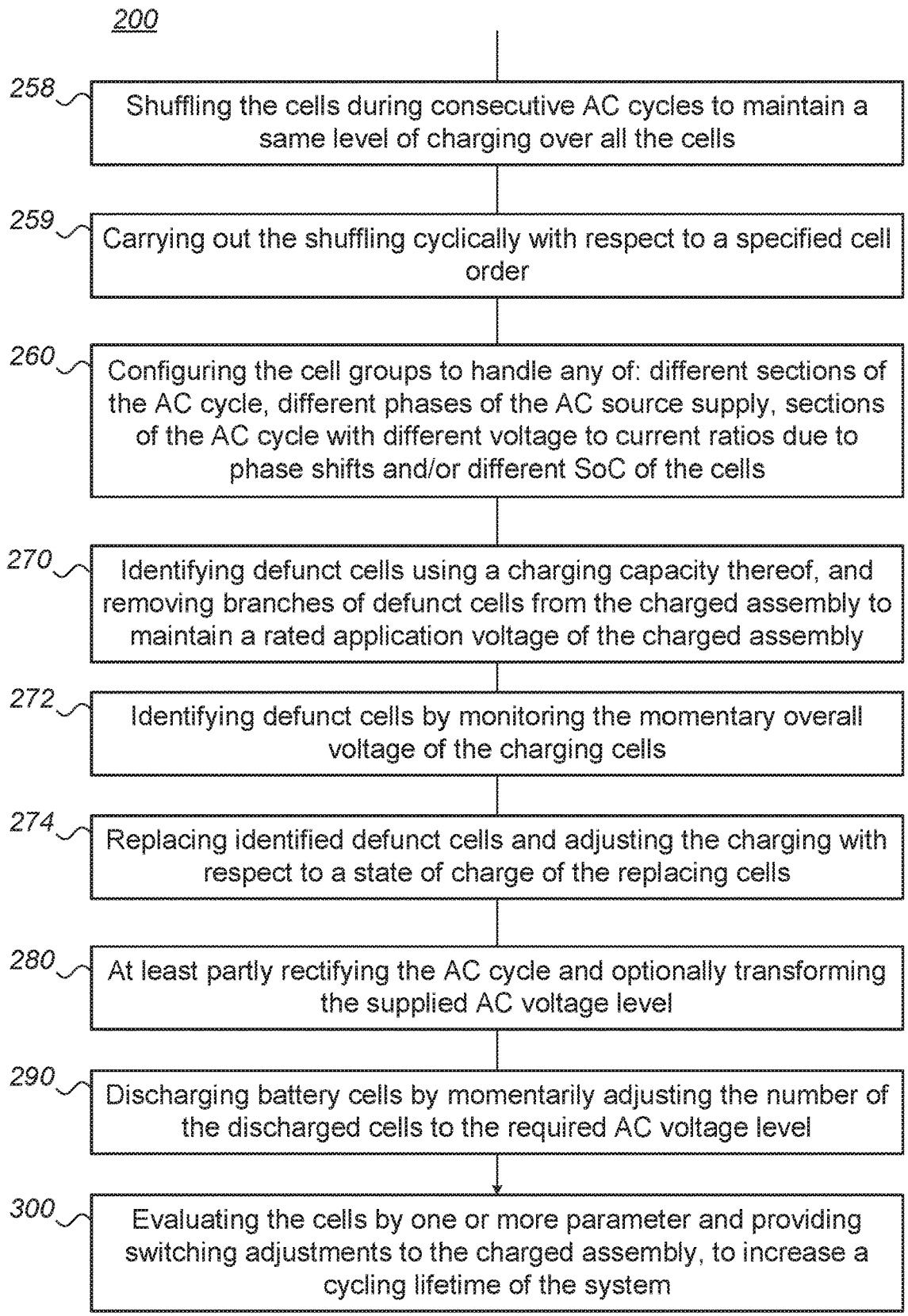
Figure 9 (continued, 2.)

DIRECT CHARGING OF BATTERY CELL STACKS

BACKGROUND OF THE INVENTION

1. Technical Field

The present invention relates to the field of energy storage, and more particularly, to charging methods and systems for cell stacks.

2. Discussion of Related Art

Rechargeable batteries are gaining an increased range of applications, which requires optimization of charging processes and management of the battery cells to maximize their output and efficiency.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method for charging battery cells, comprising: arranging a plurality of battery cells in a charged assembly comprising a plurality of parallel-connected branches, each branch having serially connected cells, wherein cell groups in the charged assembly each comprise at least one cell, and each cell group is switchable within and/or between the branches; charging the charged assembly from an alternating current (AC) source that supplies an AC voltage level at an AC cycle, by momentarily adjusting the cell groups that are being charged in the charged assembly according to voltage and/or current levels that are momentarily supplied by the AC source, and continuously rearranging the cell groups that are being charged to equalize at least one cell parameter among the cells selected from a state of charge (SoC) or a state of health (SoH) and related parameters.

One aspect of the present invention provides methods and systems for charging a plurality of battery cells, comprising providing a plurality of battery cells, each being chargeable at a voltage v (v can vary among battery cells and/or groups of battery cells), from an AC source that supplies an AC voltage level V at an AC cycle, by momentarily adjusting a number n of battery cells constituting a charged assembly of the battery cells, (e.g., via a switching unit and a controller), wherein each time $V \geq nv$, another, $(n+1)^{th}$, cell (or cell group) is added to the charged assembly, and each time $V \leq (n-1)v$, one, $n^{th}$, of the cell (or cell groups) is removed from the charged assembly.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1A:
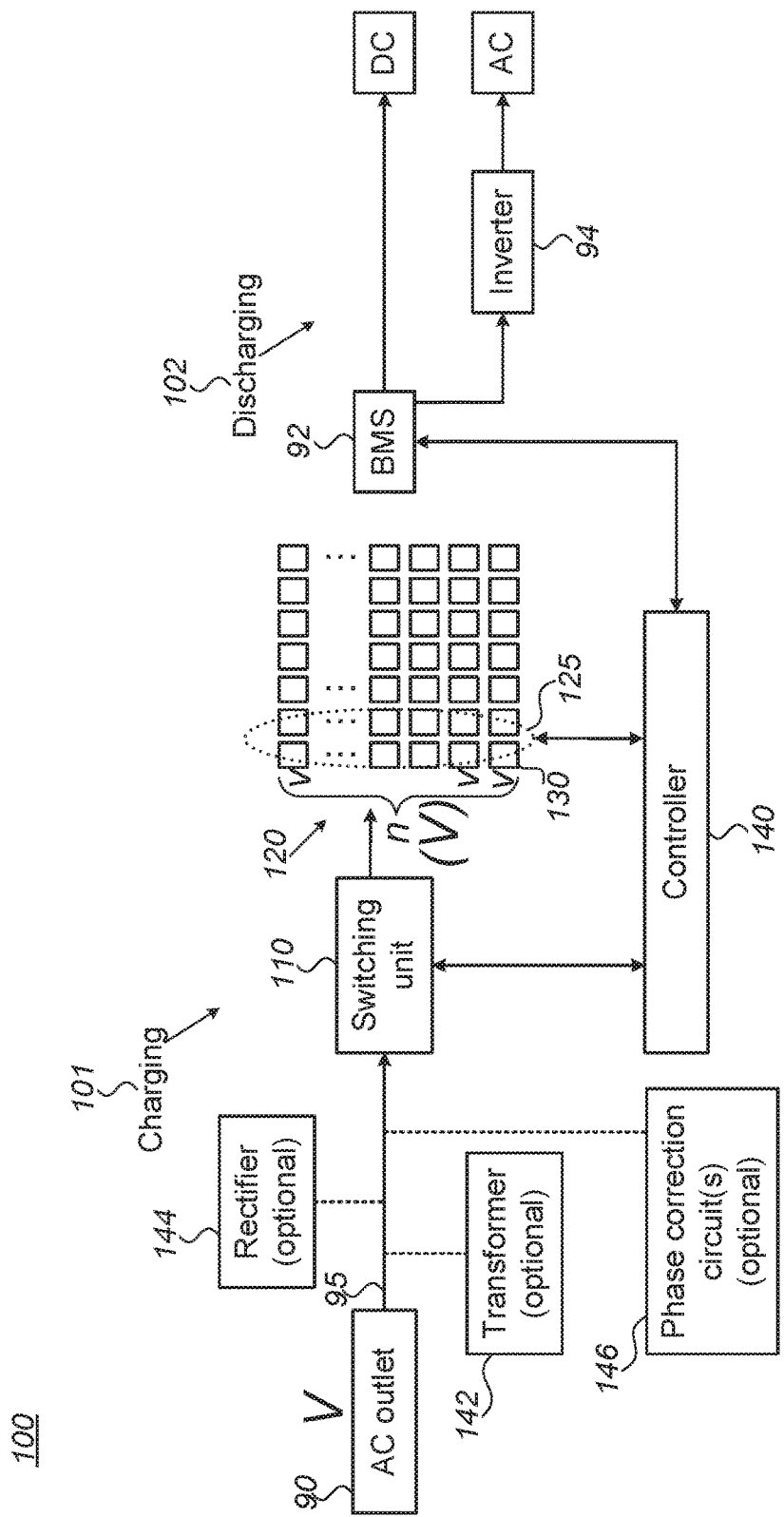
FIGS. 1A and 1B are high-level schematic block diagrams of systems, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanism for charging battery cell stack and thereby provide improvements to the technological field of energy storage. Charging methods and systems are provided which charge multiple cells directly from an AC source, by adjusting, momentarily, the number of charged cells to the momentary voltage level provided by the AC source. Cells are rapidly switched in and out to correspond to the provided voltage level, and the charging level of each cell is regulated by the switching order of the cells—determined according to cell characteristics such as state of charge and state of health. Advantageously, charging losses are reduced significantly in the disclosed systems and methods, and an additional level of cell control is provided. The charged assembly of cells may be arranged and re-arranged in various configurations to optimize the charging scheme, e.g., to equalize the charging states of the cells to simplify the use and improve the efficiency of the cell stack.

Figure 1B:
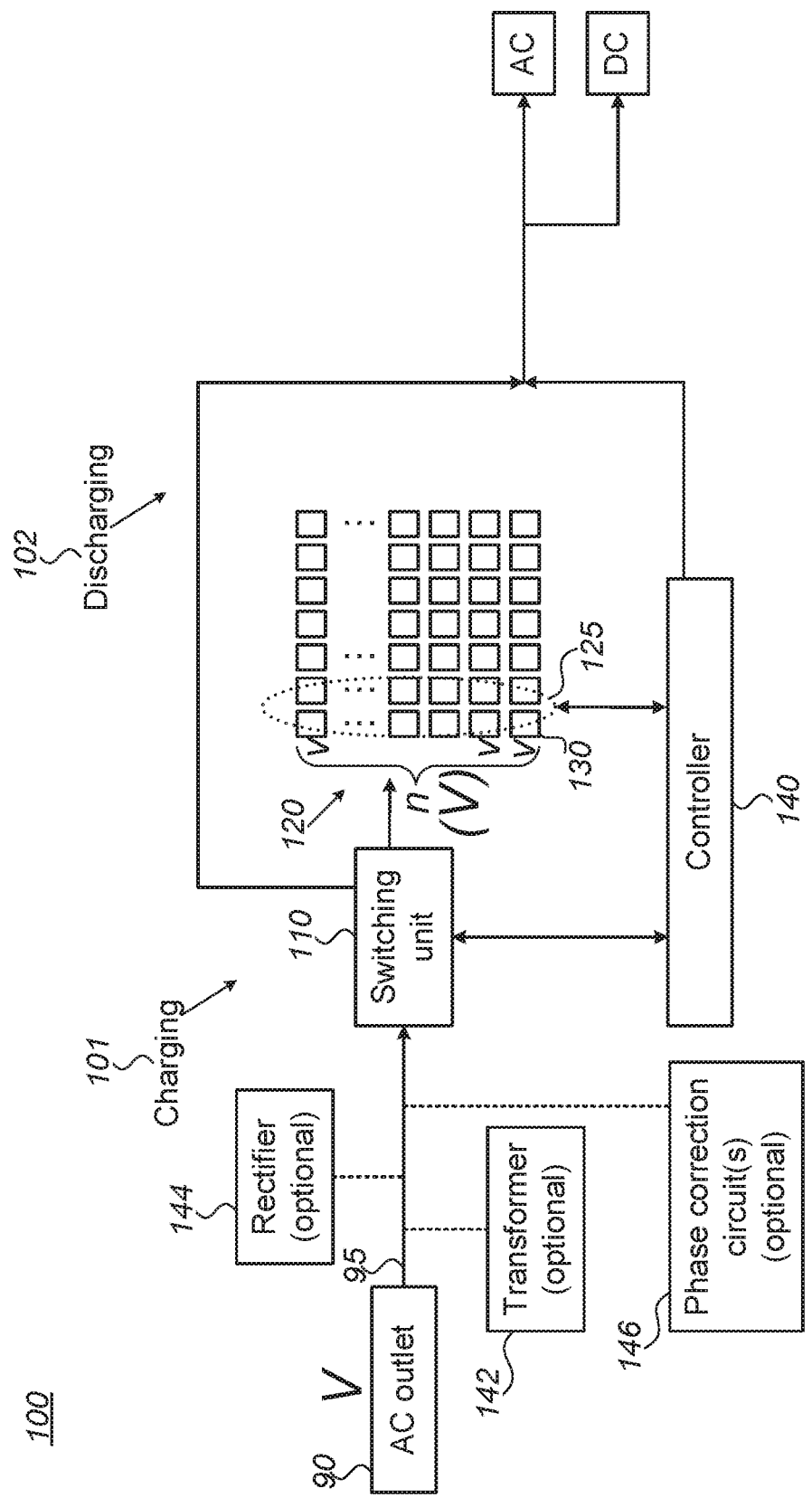

FIGS. 1A and 1B are high-level schematic block diagrams of systems 100, according to some embodiments of the invention. Systems 100 are illustrated in a highly schematic manner, and may be implemented by various circuit configurations, which are considered part of the present disclosure. Systems 100 are configured to charge cell arrays using various sources, which are represented herein in a non-limiting manner by an AC source 90. Other power sources may comprise any of electric vehicles, photovoltaic systems, solar systems, grid-scale battery energy storage systems or any other power system delivering AC power. Systems 100 may be used to deliver energy by discharging the cells to any power source, e.g., any of electric vehicles, photovoltaic systems, solar systems and grid-scale battery energy storage systems.

Systems 100 comprise a plurality 120 of battery cells 130, each chargeable at a voltage v, a switching unit 110 configured to modify a connection scheme of cells 130 to define a charged assembly 125 (see non-limiting examples in FIGS. 2A-4 and below) of battery cells 130 with respect to AC source 90 that supplies an AC voltage level V at an AC cycle 95, and a controller 140 configured to control switching unit 110, to momentarily adjust a number n of charged cells 130 in charged assembly 125, wherein each time $V \geq nv$, another, $(n+1)^{th}$, cell 130 is added to the charged assembly, and each time $V \leq (n-1)v$, one, $n^{th}$, of cells 130 is removed from charged assembly 125.

It is noted that individual cells 130 with charging voltage v may comprise a group or subset of cells 130, cumulatively chargeable with charging voltage v, which may be a multiple of the single cell charge. Moreover, the charging voltage v may vary among cells 130 and/or the cell groups—initially and/or during operation. Cells 130 and the cell groups may be switched and/or modified during operation to yield different cell groupings with respective different charging voltage v, as cells 130 are being charged.

System 100 is illustrated schematically as having a charging section 101 with switching unit 110 and controller 140, and a discharging section 102 which may comprise a battery management system (BMS) 92 and optional inverter 94 for supplying DC (direct current) and/or AC (alternating current), possibly unmodified with respect to the prior art—as illustrated schematically in FIG. 1A. In certain embodiments, controller 140 and BMS 92 may be in communication and share data concerning state parameters of cells 130 (e.g., state of charge, SoC, state of health, SoH, etc.).

In certain embodiments, discharging section 102 may comprise switching unit 110 and controller 140 that perform the charging—as illustrated schematically in FIG. 1B, applying similar concepts as described below. Specifically, controller 140 and switching unit 110 may be further configured to discharge battery cells 130 by momentarily adjusting the number of discharged cells 130 and their array configuration as described below—to a required AC voltage level.

In certain embodiments, cells 130 in charged assembly 125, or in each charged assembly 125, in case multiple assemblies 125 are used for different parts of charging 101, may be allocated dynamically by controller 140 according to various criteria. The voltage of the received AC input may be reduced by a transformer to reduce the number of cells participating in each cycle.

In various embodiments, systems 100 may further comprise a rectifier 144 configured to rectify the AC cycle prior to the charging. Rectified AC (see, e.g., FIG. 3) may be used to charge all cells in assembly 125 during each half AC cycle. Rectifier may be use intermittently, according to AC source availability, state of charge of cells 130, user requirements etc.

In various embodiments, system 100 may further comprise a transformer 142 configured to transform the AC cycle prior to the charging. For example, the AC voltage level V may be reduced to make system 100 operable with a smaller total number of cells 130, or with cells 130 having lower voltage v.

In various embodiments, systems 100 may further comprise one or more phase correction circuits 146 configured to correct phase differences which may occur between charging voltage and current of AC source 90.

Plurality 120 of cells 130 may be used, e.g., as stack 120 of cells 130 in a range of various applications, such as electric vehicles, energy storage applications etc.

Non-limiting examples for controlling schemes are illustrated in the following FIGS. 2A-6. It is noted that embodiments that follow may be combined in any operable combination, and the illustration of certain elements in certain figures and not in others merely serves an explanatory purpose and is non-limiting.

FIGS. 2A-5F are high-level schematic illustrations of various controlling schemes of charged assembly 125, according to some embodiments of the invention. In the figures, a schematic illustration of power from AC source 90 is shown, accompanied by a schematic stepped line 121 referring to the sequential addition (or removal) of cells 130 from being charged, forming a cascade, or echelon of cells 130 in charged assembly 125, which are added or removed for a momentary set of charged cells 130 as the AC source voltage rises and diminishes. The stepped voltage level (121) is distributed among cells 130 in charged assembly 125 according to various schemes, depending on controlling and operation considerations which may be optimized initially, during the charging process and/or possibly involving feedback loop(s) from BMS 92 and/or a user, e.g., in relation to a state of health (SoH) of cells 130 measured by BMS 92 and/or user specifications such as expected power requirements. The management of cells 130 in charged assembly 125 is illustrated schematically and explained below.

Figure 2A:
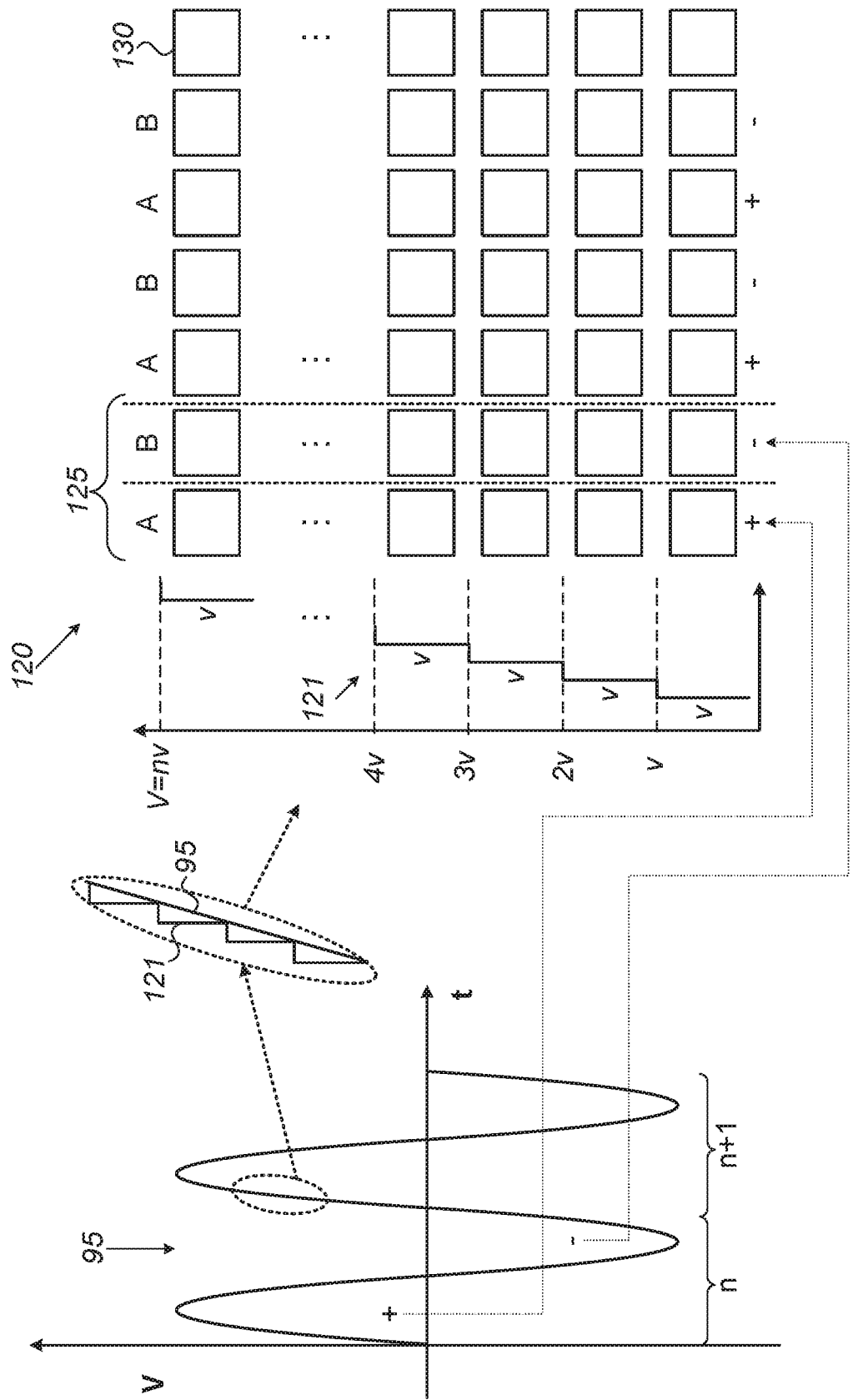
FIGS. 2A-5F are high-level schematic illustrations of various controlling schemes of the charged assembly, according to some embodiments of the invention.

For example, FIG. 2A illustrates schematically an adjustment of the number n of charged cells with respect to a sign of the AC cycle, allocating different sub-sets 125A, 125B of cells 130 from charged assembly 125 to be charged during a positive and a negative cycle part of AC cycle 90, respectively. The order of cells 130 in each sub-set 125A, 125B may be changed continuously or periodically, to reach uniform charging of all cells 130, irrespective of their ordered position in respective sub-set 125A, 125B. In certain embodiments, cells 130 may be switched between sub-sets 125A, 125B and/or removed from charged assembly, at least temporarily. It is noted that plurality 120 of battery cells 130 may comprise a single charged assembly 125, with sub-sets 125A, 125B charged recurrently during consecutive cycles of AC source 90, and/or plurality 120 of battery cells 130 may comprise multiple charged assemblies 125, with different sub-sets 125A, 125B charged during consecutive cycles of AC source 90. In various embodiments, charged assembly 125 may be kept the same over multiple cycles of AC source 90 or charged assembly 125 may be modified during consecutive cycles of AC source 90, according to charging parameters and criteria of plurality 120 of battery cells 130, as managed, e.g., by controller 140.

In certain embodiments, charged assembly 125 may comprise array 120 of cells 130, and the serial/parallel connectivity of cells 130 in array 120 may be rearranged with respect to various performance parameters, as provided herein in the examples or their combinations.

In various embodiments, AC charging current, e.g., from AC outlet 90, may be used to charge assembly 125 of cells 130 (e.g., fast charging batteries or battery modules) by allocating dynamically a changing number of cells 130 according to the momentary level of voltage received from outlet 90. In a non-limiting schematic example, assuming the maximal outlet voltage is V=220V and the cell voltage is v=4V, the number of charged cells (in first sub-set 125A) may be increased from 1 to 55 during a quarter cycle, then reduced back to 1 during the next quarter cycle, and then separate group 125B of cells 130 may be charged in a similar way during the negative part of the cycle. In the schematic example, the n=110 cells may be used again in the next cycle (e.g., at 50 Hz), the cell order may be shuffled (so that, e.g., the first cell that is charged through the full half cycle is switched with the 55$^{th}$ cell that is only charged at the cycle peak, and intermediate cells are switch to equalize the amount of charge they receive), or multiple cell groups may be used to be charged in each cycle.

It is noted that in any of the disclosed embodiments, groups of charged cells in charged assembly 125 (e.g., 125A, 125B in FIG. 2A) may be distinct and include different cells, or may have some or full overlap, sharing the same cells, possibly re-ordered. Moreover, cells 130 may be charged in serial connection, parallel connection or combined connection, according to the momentary voltage and current values provided by AC source 90, according to the state of cells 130, according to specified charging plans (e.g., specified periods of constant current or constant voltage charging) and according to additional switching and cell management considerations, e.g., as described below. For example, groups of cells 130 (e.g., in modules or in packs) may be combined in parallel to achieve a group of cells with effectively higher capacity and/or be combined in series to achieve a group of cells with effectively higher voltage, as well as combinations thereof. Received power 95 from AC source 90, e.g., in form of a sine wave 90, may be divided into steps (as illustrated very schematically in FIG. 2A) to match the voltage and/or current characteristics of the respective group of cells rather than of a single cell. In this respect, in any of the disclosed embodiments, cell 130 may be replaced by a group of cells 130.

Clearly, the AC source voltage may have any used value, e.g., 220V, 110V or any value between tens of volts and hundreds or even thousands of volts, and the AC source frequency may have any used value, e.g., 50 Hz, 60 Hz or other frequencies, in tens of hundreds of hertz. It is noted that disclosed embodiments may be adjusted to use any type of cell 130, with respect to chemistry and performance parameters, correspondingly adjusted to any voltage or current characteristics.

Figure 2B:
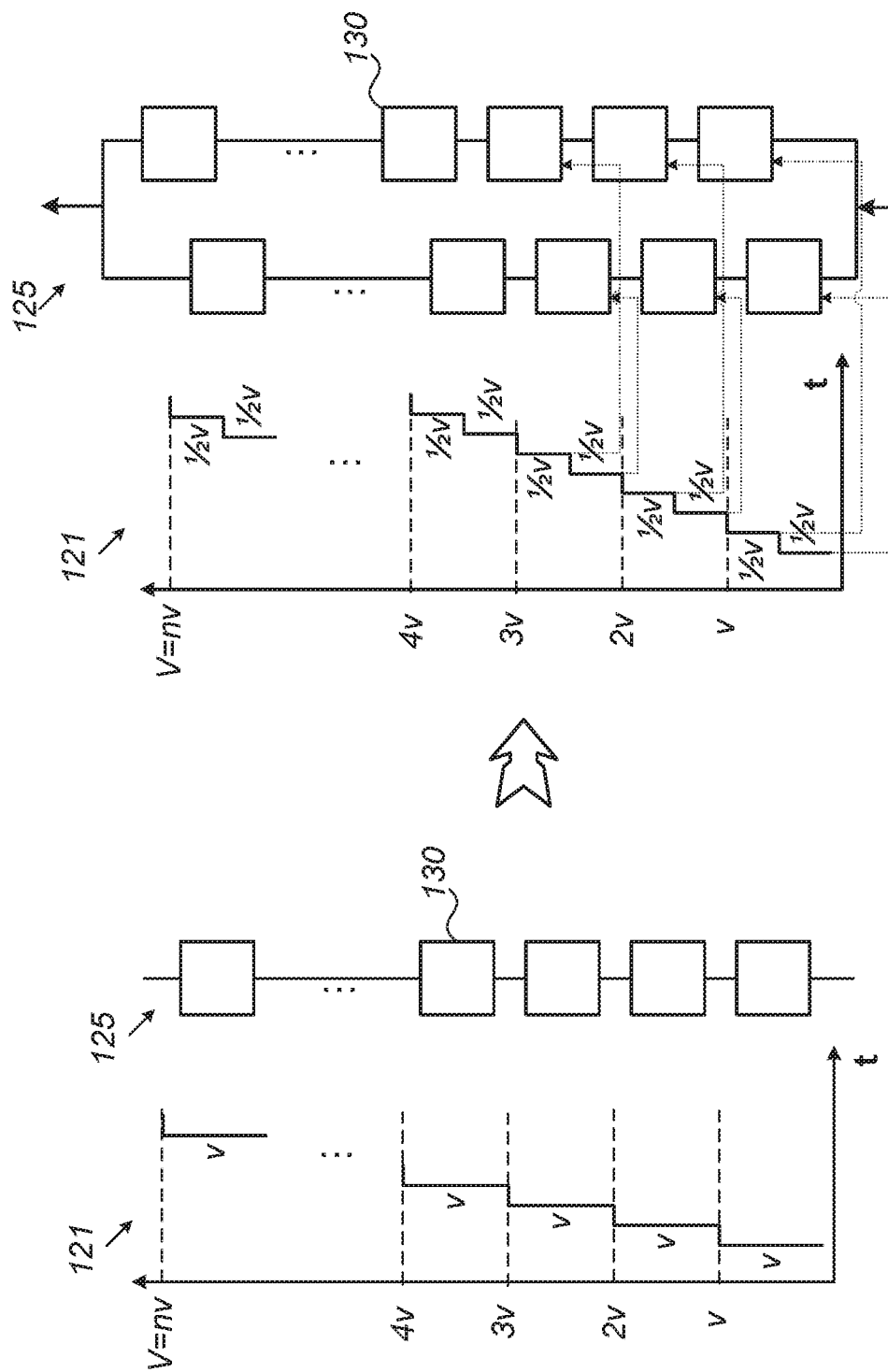

FIG. 2B illustrates schematically the adjustment of the smoothness in which the stepped sine charging curve (121) follows the voltage supplied (95) by AC supply 90. As illustrated schematically, subsets of cells 130 of charged assembly 125 may be connected in parallel and be shifted in time with respect to the commencement of their charging from AC source 90. As illustrated schematically, cells 130 from either sub-set may be added (or removed) alternatingly to the cells being charged, reducing the voltage steps, in the illustrated non-limiting example, by half (v→½v). For example, in case cells 130 are charged at steps of v=3V, using two parallel sub-sets as described reduces the charging steps to ½v=1.5V. The number of parallel sub-sets of cells 130 in charged assembly 125 may be adjusted according to the required level of smoothening of the charging process.

Figure 3:
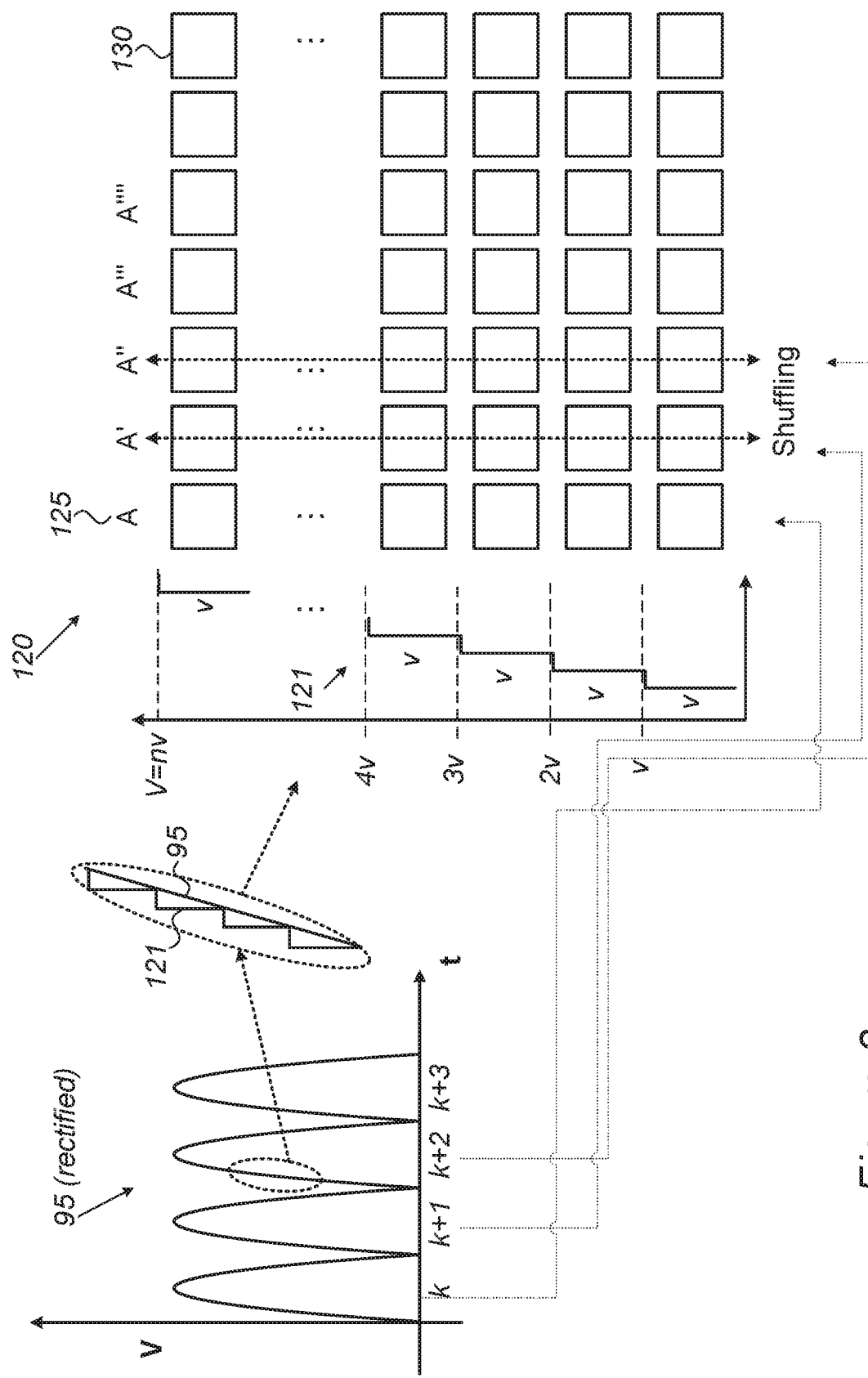

In the example presented schematically in FIG. 3, cells 130 in charged assembly 125 may be continuously shuffled, as indicated schematically by the double-headed arrows and by numerals 125A, 125A', 125A", 125A''', 125A"", etc. In certain embodiments, AC source 90 may be rectified (e.g., by rectifier 144) to yield sub-cycles k, k+1, k+2, k+3, k+4 etc. possibly corresponding to the shuffles of assembly 125 and charging the corresponding cells. In certain embodiments, the number n of charged cells may be adjusted with respect to a level of charging of cells 130, maintaining a same level of charging of cells 130. The state of charging (SoC) of each cell 130 may be directly measured and monitored, e.g., by controller 140 and/or BMS 92 and/or the shuffling scheme may be adjusted according to estimated SoCs of cells 130, e.g., with respect to discharging patterns thereof. In various embodiments, charged assembly 125 may be kept the same over multiple cycles of AC source 90 or charged assembly 125 may be modified during consecutive cycles of AC source 90, according to charging parameters and criteria of plurality 120 of battery cells 130, as managed, e.g., by controller 140.

Figure 4:
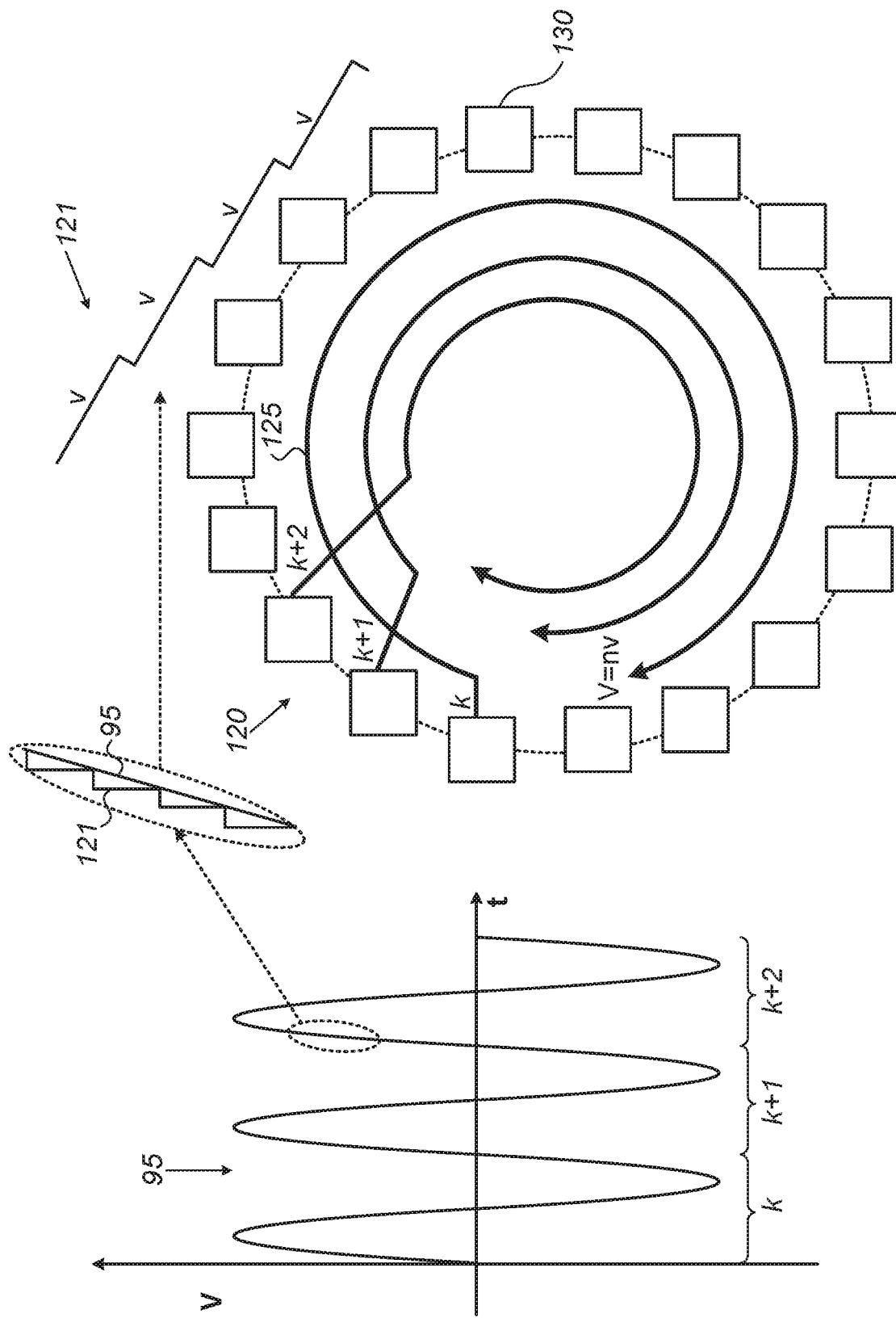

In the example presented schematically in FIG. 4, cells 130 in charged assembly 125 may be arranged, conceptually or in respective circuit(s), as a cycle, with consecutive AC cycles k, k+1, k+2 being used to charge charged assembly 125 at an order of cells 130 which is continuously rotated (or shuffled) to consecutive move the first cell to be charged to an end position in the charging cycle, denoted schematically by respective cycles k, k+1, k+2.

Figure 5A:
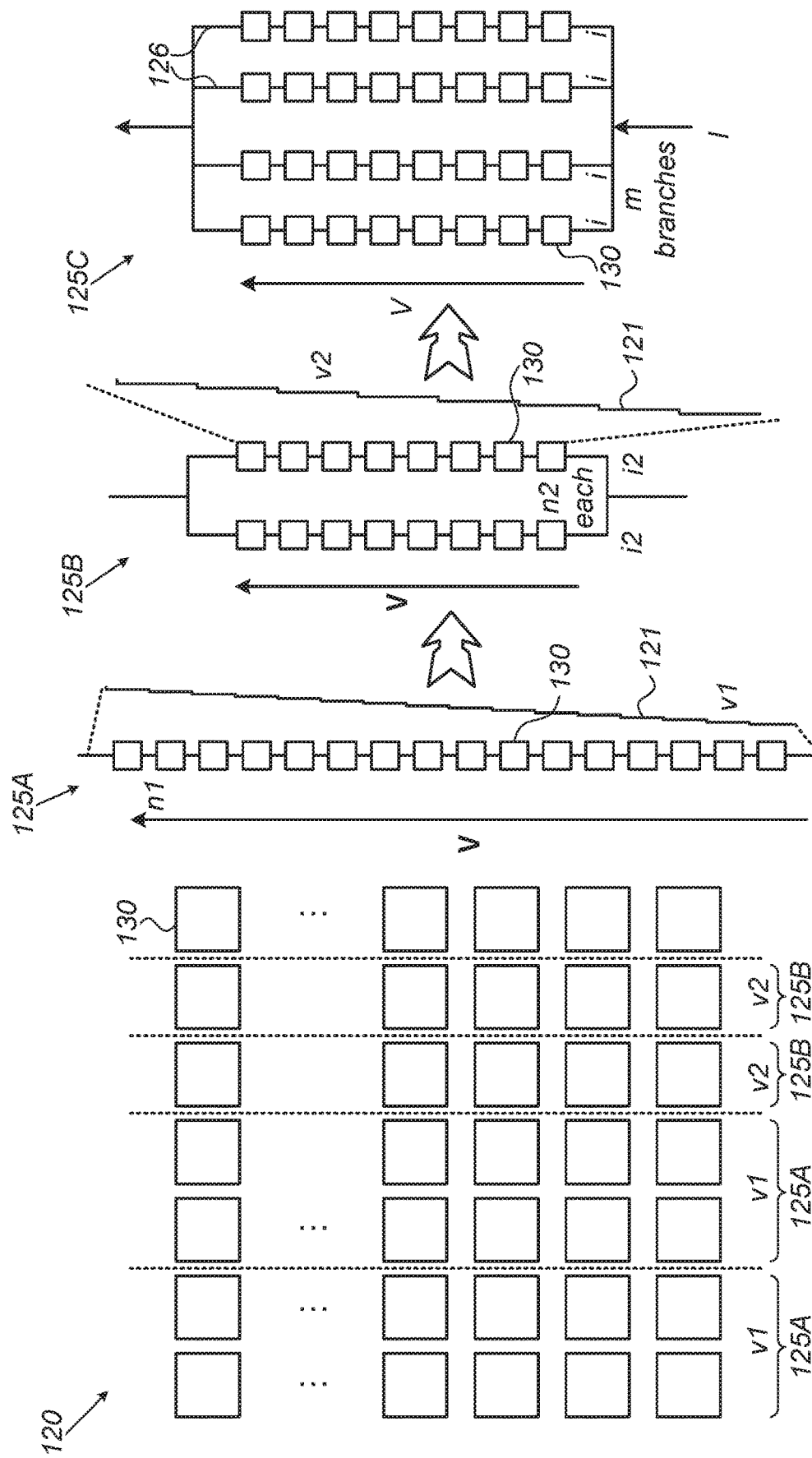

In the example presented schematically in FIG. 5A, cells 130 in charged assembly 125 may be connected serially and/or in parallel, depending on the SoC of cells 130, e.g., charged assembly 125 in a first state 125A may comprise $n_1$ cells 130 with low SoC (denoted by $v_1$) connected in series with a current $i_1$ flowing through the cells, while charged assembly 125 in a second state 125B may comprise cells 130 with high SoC (denoted by $v_2$) connected in parallel groups (having $n_2$ cells each), with a current $i_2$ flowing through each of the groups. Correspondingly, $n_1 \cdot v_1 = V$ and $n_2 \cdot v_2 = V$ and $i_2 > i_1$.

In certain embodiments, the number n of charged cells may be adjusted with respect to the current, I, supplied (95) by AC source 90, according to maximal current (i) specifications of cells 130. For example, in case I=m·i (e.g., in case I=10 A supplied by AC source 90 and maximal cell current i=1 A, then m=10), the charging current may be split among m cell sub-sets 125C, as illustrated schematically in FIG. 5A.

In certain embodiments, the number n of charged cells may be adjusted with respect to a current to voltage, i/v ratio of the cells and/or with respect to the phase between the voltage and the current, maintaining required maximal i and v for all cells. In certain embodiments, switching unit 110 may be configured to switch between serial and parallel connection of cell subsets to maintain the required current and voltage values over all cells 130, e.g., a constant i/v ratio if the supplied voltage and current (95) are synchronous, or, in other cases, managing both the voltage and the current applied to the cells being charged as explained below.

In certain embodiments, charged assembly 125 may comprises multiple branches 126, each with a serially connected sub-set of cells 130, with controller 140 and/or switching unit 110 further configured to adjust a number and/or a polarity of branches 126 and/or cells 130 in each branch 126 in charged assembly 125 to accommodate for current-voltage relations of AC source 90, as explained below.

It is noted that while FIG. 5A illustrates schematically the increasing number of branches 126 as cells 130 are charged, an opposite operation of decreasing the number of branches 126 may also be performed, e.g., to introduce additional cells 130 to the charged assembly 125, to adjust the charging rate of cells 130, to modify the charging currents and/or to modify the correspondence between stepped sine charging curve 121 and supplied voltage 95.

It is further noted that in any of the disclosed embodiments, any of cells 130 may be replaced by a group of cells 130 such as partial charged assemblies 125A, 125B, 125C or any other configuration of serially and/or parallel connected cells 130, with corresponding adjustment of the charging steps (121) with respect to the voltage and current curves 95 supplied by AC source 90.

FIGS. 5B-5F are high-level schematic illustrations of various controlling schemes of charged assembly 125 with respect to various phase and amplitude relations between the voltage and the current 95 supplied by AC source 90, according to some embodiments of the invention. Each of FIGS. 5B-5F illustrates schematically variants on the phase and amplitude relations between the voltage and the current 95 supplied by AC source 90, over a single cycle and related switching configurations. Various embodiments comprise combinations thereof, including changes in these relations over time, which may be accompanied by corresponding changes of the switching and control schemes.

Figure 5B:
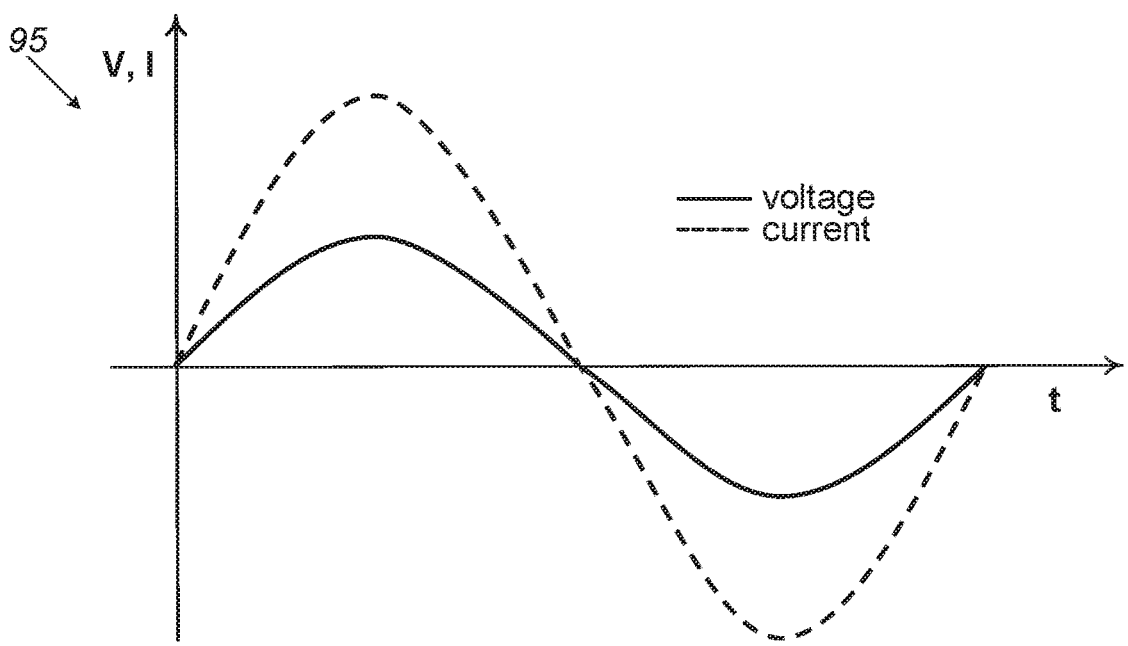

FIG. 5B illustrates schematically a case in which there is no phase difference between the voltage V and the current I supplied (95) by AC source 90. In such case, the ratio V/I is constant over time and respectively the configuration of cell subsets may be managed only with respect to the required maximal current and voltage values on each cell 130. For example, similar to the explanation above concerning the splitting of V among n serially-connected cells with v applied to each (see e.g., FIG. 2A)—a current I supplied by AC source 90 may be split into m parallel-connected cell subsets (see, e.g., assembly 125C in FIG. 5A) so than I=m·i, with i being the maximal allowable current for each individual cell 130. In each of the m parallel branches 126, the voltage V is split over n cells with V=n·v, with v being the maximal allowable voltage for each individual cell 130. In certain embodiments, illustrated schematically in FIG. 5C, the number of cells 130 in each branch 126 may be variable, e.g., denoted by $n_j$ for the $j^{th}$ branch, so that in each branch V=$n_j$·v and the currents $$I = \sum_{j=1}^{m} i_j$$

with each $i_j \le i$ (max). The number of cells in each branch ($n_j$) and the number of branches (m) may be adjusted (possibly momentarily) by switching unit 110 and/or controller 140 according to the charging status of cells 130. In case the maximal allowable current differs among cells 130, the maximal current per branch 126 may be set as the lowest maximal current among the cells ($i_{j,max}$) and branches 126 in charged assembly 125C may be arrange to provide, at least momentarily currents $$I = \sum_{j=1}^{m} i_{j,max}.$$

Parallel branches 126 may be added to charged assembly 125C in order to fully utilize the supplied current I. It is noted that in case the current and voltage 95 from AC source 90 are in phase, their ration is constant and corresponding the current to voltage ration on each cell 130 remains constant, and may be determined according to requirements and the states of cells 130.

Figure 5C:
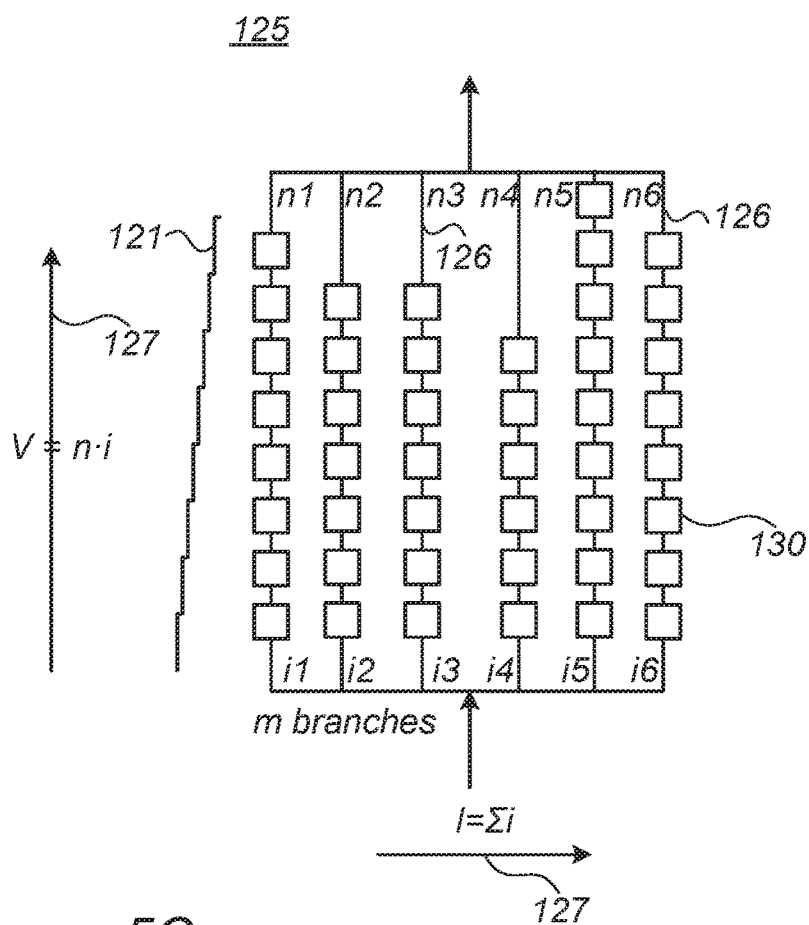

Referring further to FIG. 5C, it is noted that the number and configuration of cells 130 in charged assembly 125 may be adjusted frequently, possibly every cycle or every number of cycles of AC source 90, as illustrated schematically by arrows 127. As the momentary voltage V=$n_j$·$i_j$ for each branch j and the momentary current I=$\Sigma i_j$ over the branches, the number of cells 130 in each branch 126 and the number of branches 126 may be modified (added/removed) according to cell state, in addition to the cycling of AC source 90.

The current (I) matching may be achieved by adding or removing cells 130 that are being charged on the parallel connections (branches 126) of the battery pack (as example for charged assembly 125), while the voltage (V) matching may be achieved by adding or removing cells 130 on the series connections (within branches 126). For example, each charging step of the sine wave supplied (95) by AC source 90 may be characterized by a constant current (CC) setting or a constant voltage (CV) setting, since both, CC and CV modes are part of battery standard charging process. Constant current may be implemented by setting the current I to the value of the specific charging step and carrying out voltage increases and decreases according to the sine wave (see schematic illustration of the steps). Constant current setting may involve switching on/off the cells in series connection according to the voltage requirements to yield constant current charging. Constant voltage may be implemented by setting the voltage V to the value of the specific charging step and carrying out current increases and decreases according to the sine wave. Constant voltage setting may involve switching on/off the cells in parallel connection according to the current requirements to yield constant voltage charging. Arrows 127 indicate the respective change of voltage (V=n·i) under constant current settings and indicate the respective change of current (I=Σi) under constant voltage settings.

Figure 5D:
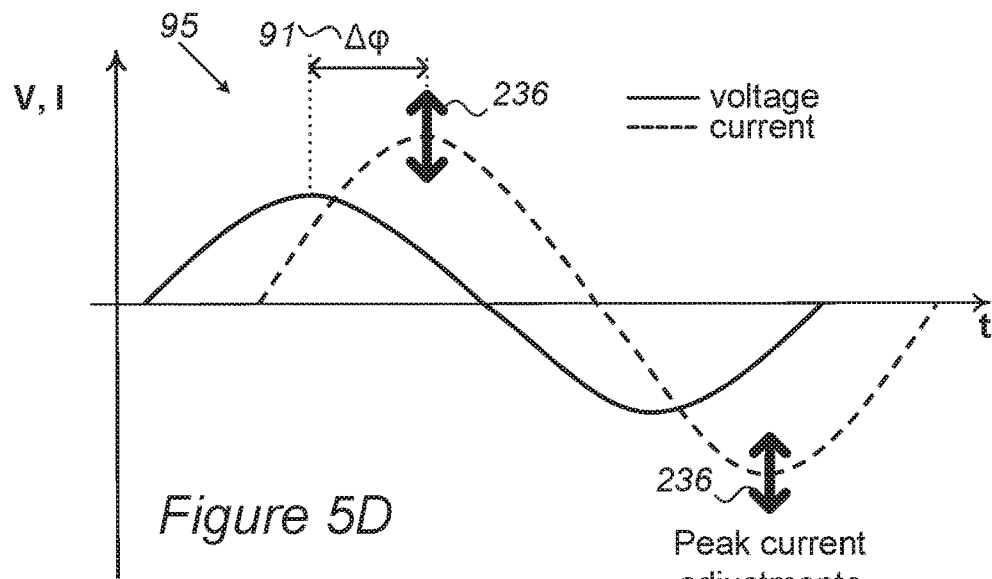
Figure 5E:
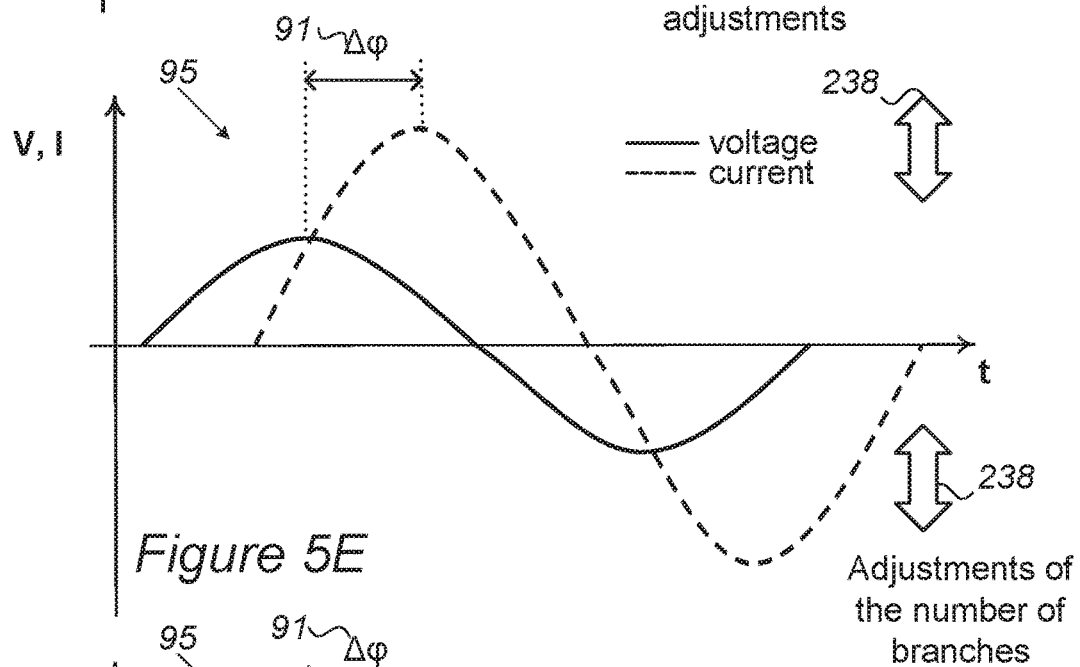
Figure 5F:
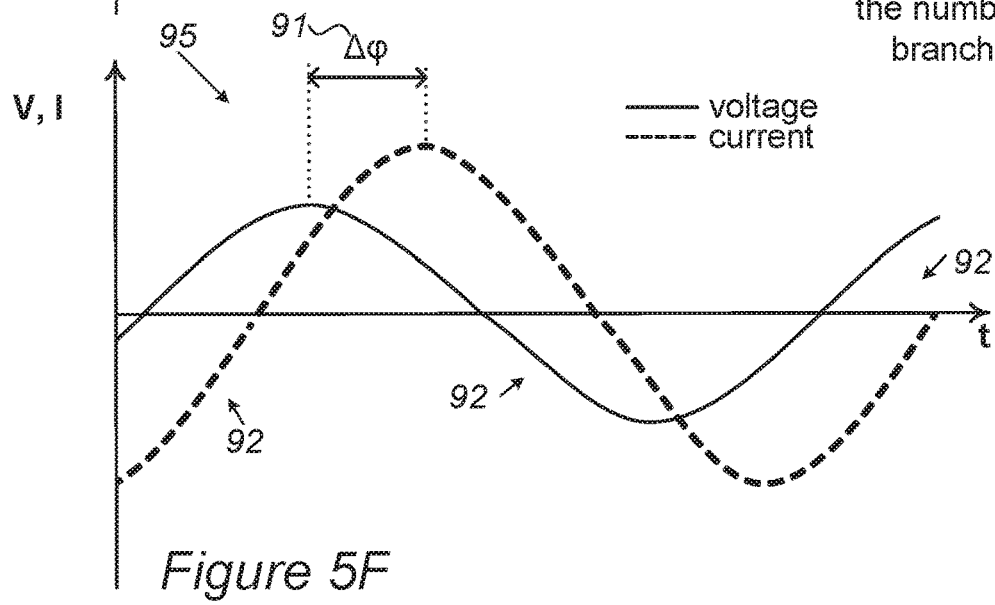

In certain embodiments, illustrated schematically in FIGS. 5D-5F, there may be a phase difference 91, denoted Δφ, between supplied voltage and current 95, in which case charged assembly 125 may be adapted in various ways to fully utilize the supplied power to charging cells 130. For example, as illustrated schematically in FIG. 5D, the peak current may be adjusted 236 according to the number of available branches 126 with respect to supplied voltage and/or current 95, as illustrated schematically in FIG. 5E, the number of branches 126 may be adjusted 238 according to the supplied peak current. In various embodiments, disclosed adjustments may be carried out, possibly momentarily, by switching unit 110 and/or controller 140 according to the charging status of cells 130.

For example, the array configuration of charged assembly 125 may be configured according to a maximal current to voltage ratio of AC source 90 to determine the number of branches 126 that can receive power at the maximal current to voltage ratio. At other parts of the AC cycle, the lower-than-maximum current to voltage ratio assures the cells can receive supplied power (at lower-than-maximal current) 95. The number of cells 130 in each branch 126 may then be determined according to the voltage and cell parameters.

In certain embodiments, some or all of the phase differences between charging voltage and current of AC source 90 may be corrected by one or more phase correction circuits 146 such as phase locked circuits and/or power factor correction circuits. The latter may be further used to reduce voltage fluctuations and harmonic noise.

In certain embodiments, the current and voltage may be temporarily opposed, as indicated by arrows 92 in FIG. 5F, in which case either the supplied AC (95) may be rectified, e.g., by rectifier 144, or controller 140 and switching unit 110 may be configured to temporarily switch terminals (contacts) of specified cells 130 and/or branches 126 of charged assembly 125 to accommodate for periods of reversed polarity. For example, referring back to FIGS. 2A and 5C, branches 126 with reverse polarities may be allocated to handle supplied currents and voltages (95) having opposite signs.

In any of the disclosed embodiments, controller 140 may be further configured to adjust a charging duration of cells 130 to control the current i flowing through cells 130.

In certain embodiments, controller 140 may be further configured to shuffle cells 130 during consecutive AC cycles to maintain a same level of charging over all cells 130. Advantageously, such control scheme simplifies cell management, as all cells 130 are kept at the same SoC during the charging 101 thereof, and differences between cells 130 that might have occurred during discharging 102 of cells 130—may be removed and cells 130 equalized during charging 101.

In certain embodiments, discharging section 102 may comprise switching unit 110 and controller 140 that perform the charging—as illustrated schematically in FIG. 1B, applying similar concepts as described above. While prior art inverters 94 typically convert DC from multiple cells to AC by time modulation, disclosed controller 140 and switching unit 110 may be configured to carry out discharging 102 by amplitude (voltage and/or current) modulation, adding and removing cells 130 from a discharged assembly that may be managed similarly to charged assembly 125, in any of the applicable embodiments disclosed above. It is noted that configurations of charged assembly 125, controller 140 and switching unit 110 may be adjusted to perform any of the disclosed charging and switching operations in a corresponding manner for discharging and switching operations.

Figure 6A:
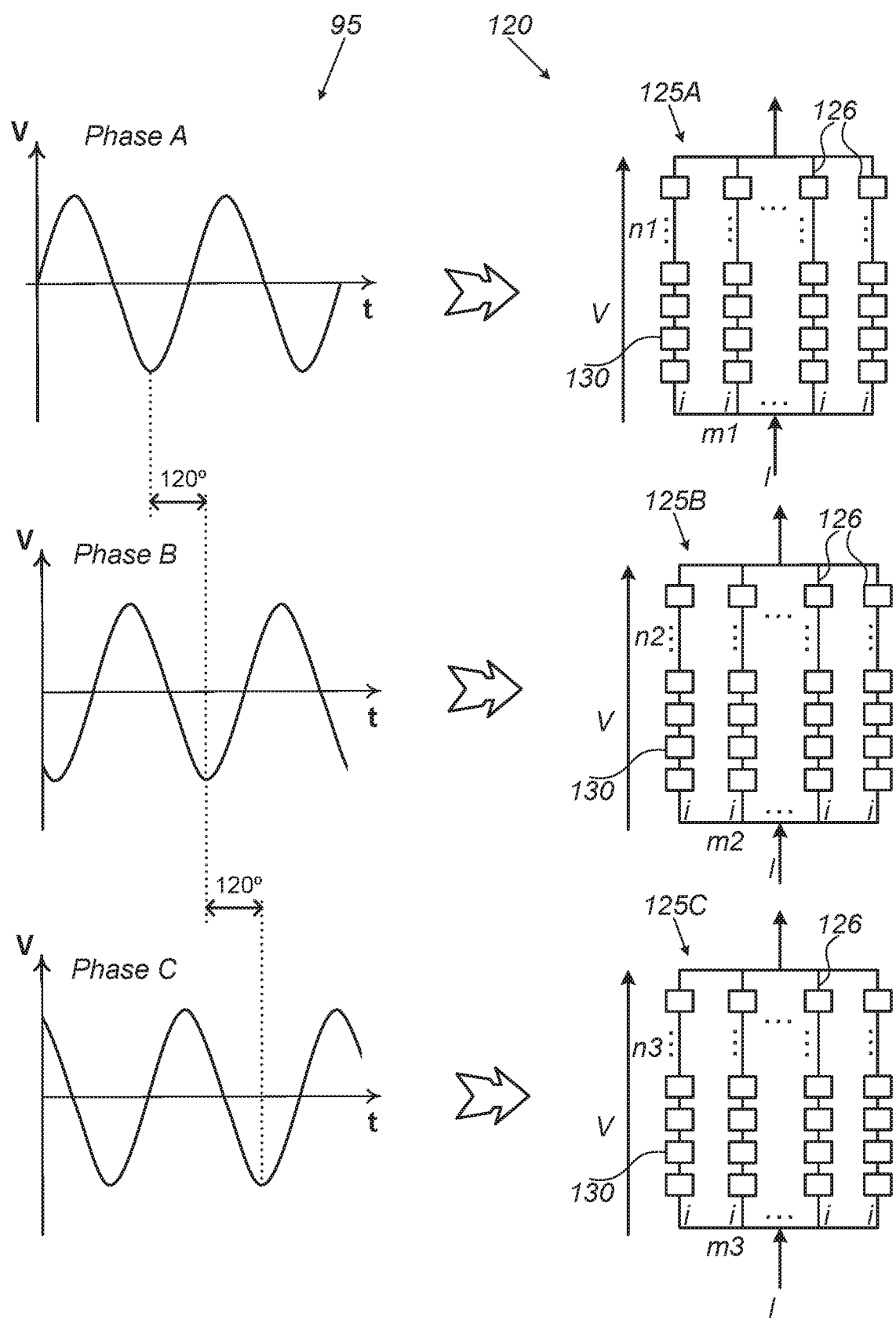
FIGS. 6A and 6B are high-level schematic illustrations of charging cells from multi-phase AC source, according to some embodiments of the invention.
Figure 6B:
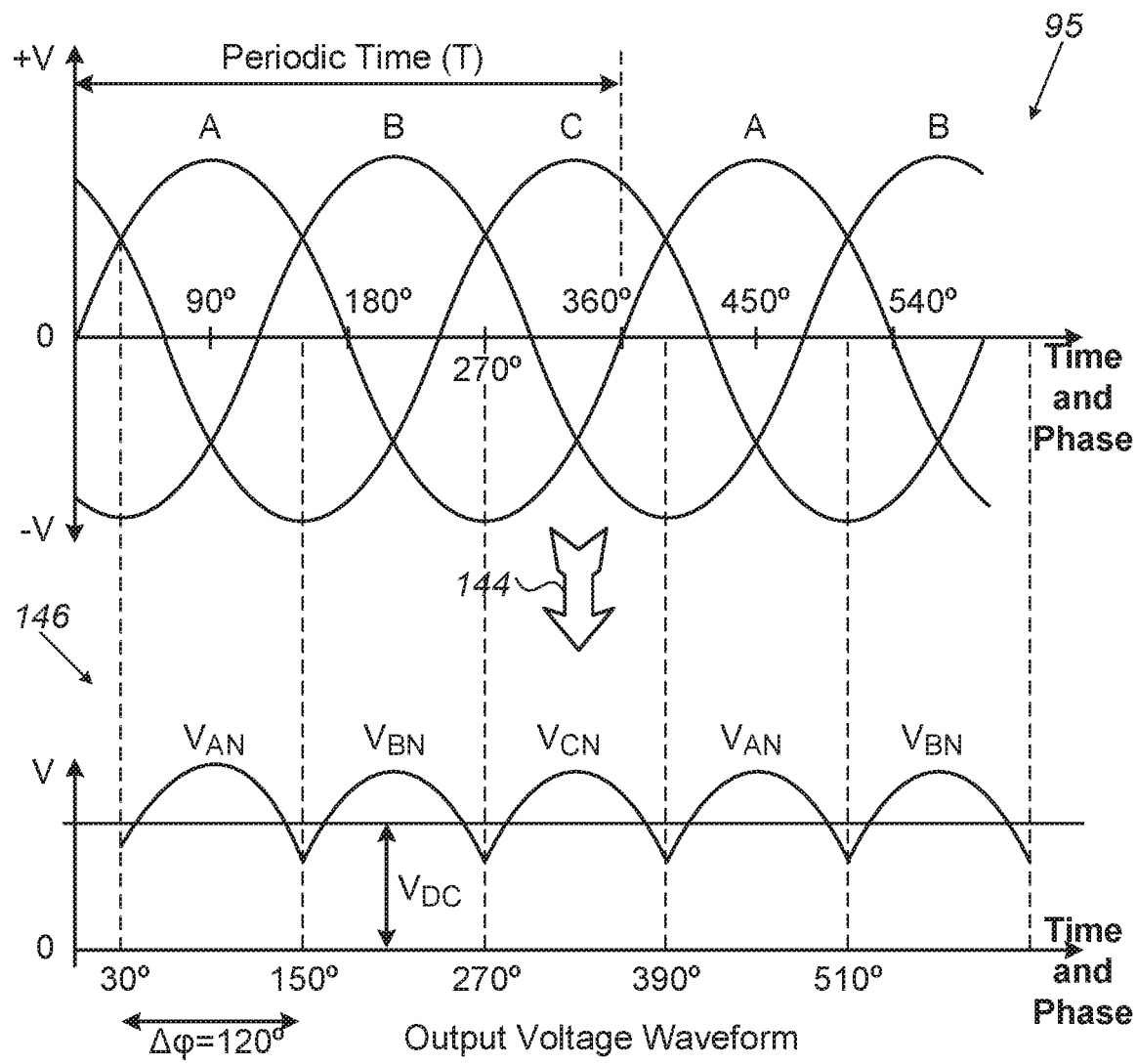
Figure 6B:
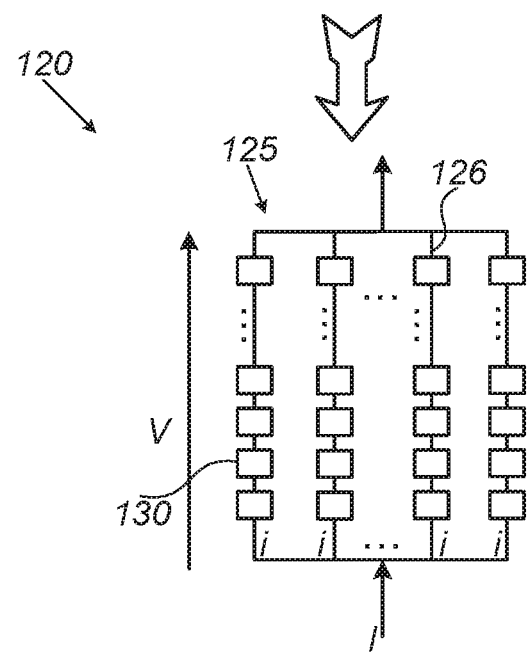

FIGS. 6A and 6B are high-level schematic illustrations of charging cells 130 from multi-phase AC source 90, according to some embodiments of the invention. In certain embodiments, for example as illustrated schematically in FIG. 6A, plurality 120 of battery cells 130 may comprise charged assemblies 125A, 125B, 125C configured to be charged from separate (e.g., three) phases of AC source 90, such as a conventional utility grid source. In the illustrated non-limiting example, AC source phases denoted A, B, C and separated by 120° may be used to charge corresponding distinct charged assemblies 125A, 125B, 125C with configurations of cells 130 and branches 126 (e.g., m1, m2, m3 branches with n1, n2, n3 cells per branch respectively, or possibly a variable number of branches and/or a variable number of cells in each branch, in correspondence to the cell states) as disclosed herein. In certain embodiments, for example as illustrated schematically in FIG. 6B, input from multiple-phase AC source 90 may be rectified 144, e.g., using half or full wave rectification into a combined wave form 146 (with $V_{AN}$, $V_{BN}$ and $V_{CN}$ corresponding to the leading phase A, B and C, and $V_{DC}$ denoting the baseline DC voltage) and then use to charge plurality 120 of battery cells 130 as one or more charged assembly 125 as disclosed herein. It is noted that more the combined waveform is rectified (the larger $V_{DC}$ is compared to the ripple represented by $V_{AN}$, $V_{BN}$ and $V_{CN}$), less switching may be required to charge cells 130 therefrom.

Figure 7A:
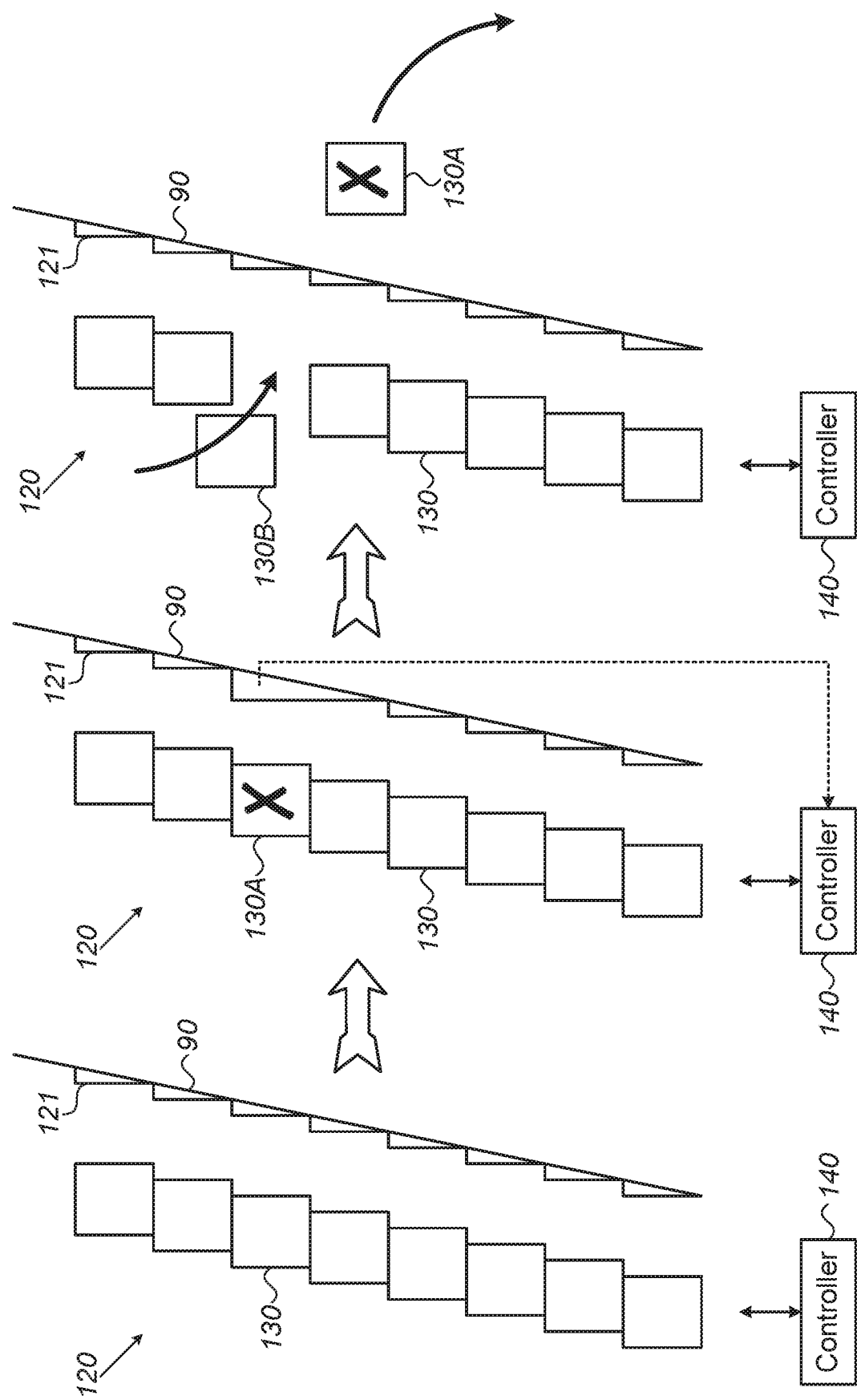
FIGS. 7A and 7B are high-level schematic illustrations of identifying and handling defunct cells, according to some embodiments of the invention.
Figure 7B:
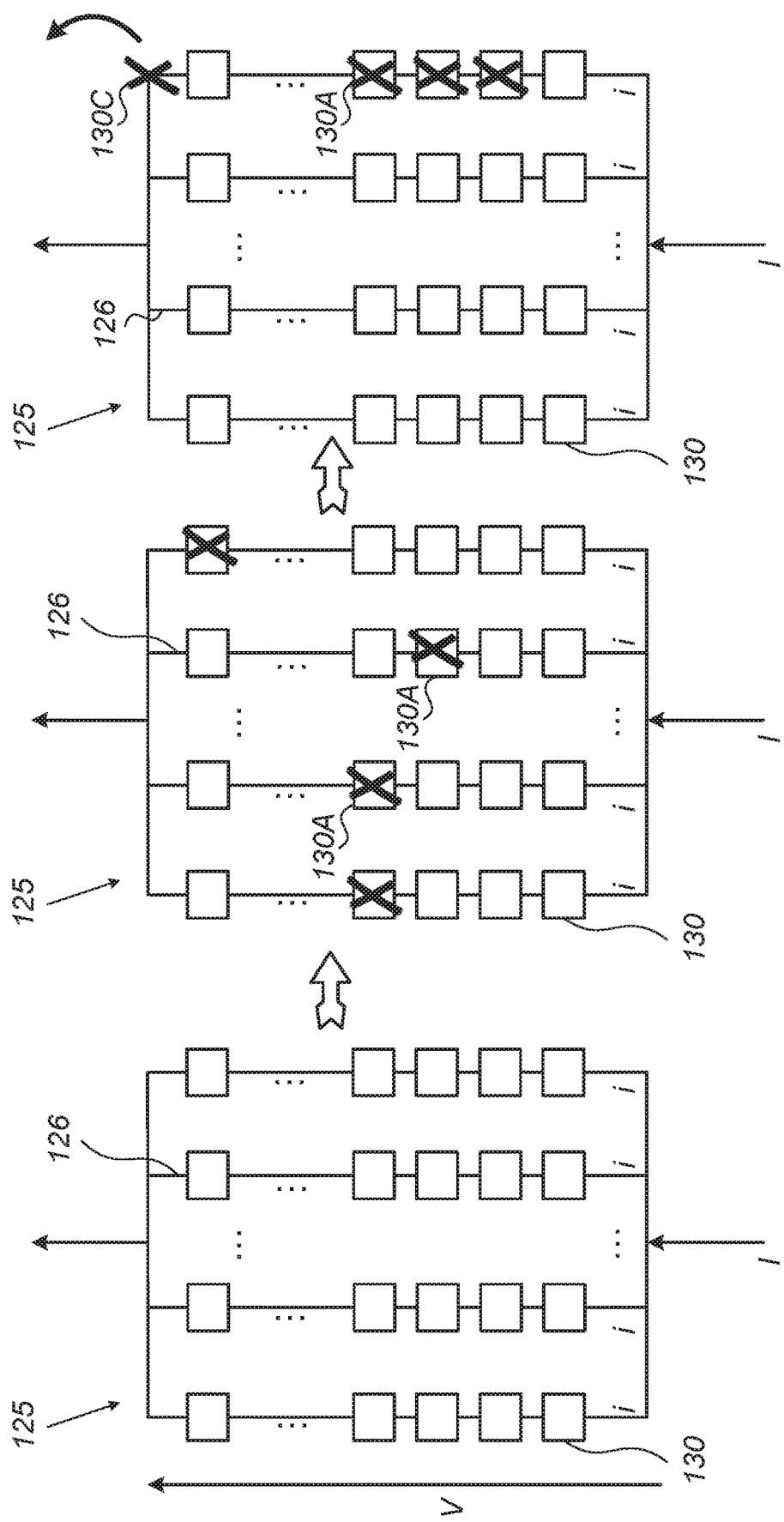

FIGS. 7A and 7B are high-level schematic illustrations of identifying and handling defunct cells, according to some embodiments of the invention. As illustrated schematically in FIG. 7A, controller 140 may be further configured to identify defunct cells 130A by monitoring the momentary overall voltage of charging cells 130, and, e.g., identifying a voltage gap different from v (illustrated schematically) which is expected from regular cells 130. Switching unit 110 may be further configured to correspondingly replace identified defunct cells 130A (e.g., by cell 130B that was outside charged assembly 125 till then) and/or controller 140 may be further configured to adjust the charging with respect to a state of charge of replacing cell(s) 130B, e.g., charge cell 130B with respect to its SoC and SoH to be equal to the rest of cells 130 in charged assembly 125.

In certain embodiments, cells 130 in charged assembly 125 may be managed group-wise, e.g., with pairs or triplets of cells 130 being added and/or removed in each step to simplify the switching operation. For example, the cell groups may be selected according to the individual cell charging state or other parameters.

As illustrated schematically in FIG. 7B, controller 140 may be further configured to rearrange the location of cells 130 with reduced capacity and/or defunct cells 130A to balance branches 126 of charged assembly 125. In certain embodiments, controller 140 may be configured to remove full branches 126 (indicated by numeral 130C) to allow loss of the corresponding capacity rather than to remove specific cells 130B within (serially connected) branches 126 and lower thereby the voltage that branch 126 handles, which corresponds to the rated application voltage.

Figure 8:
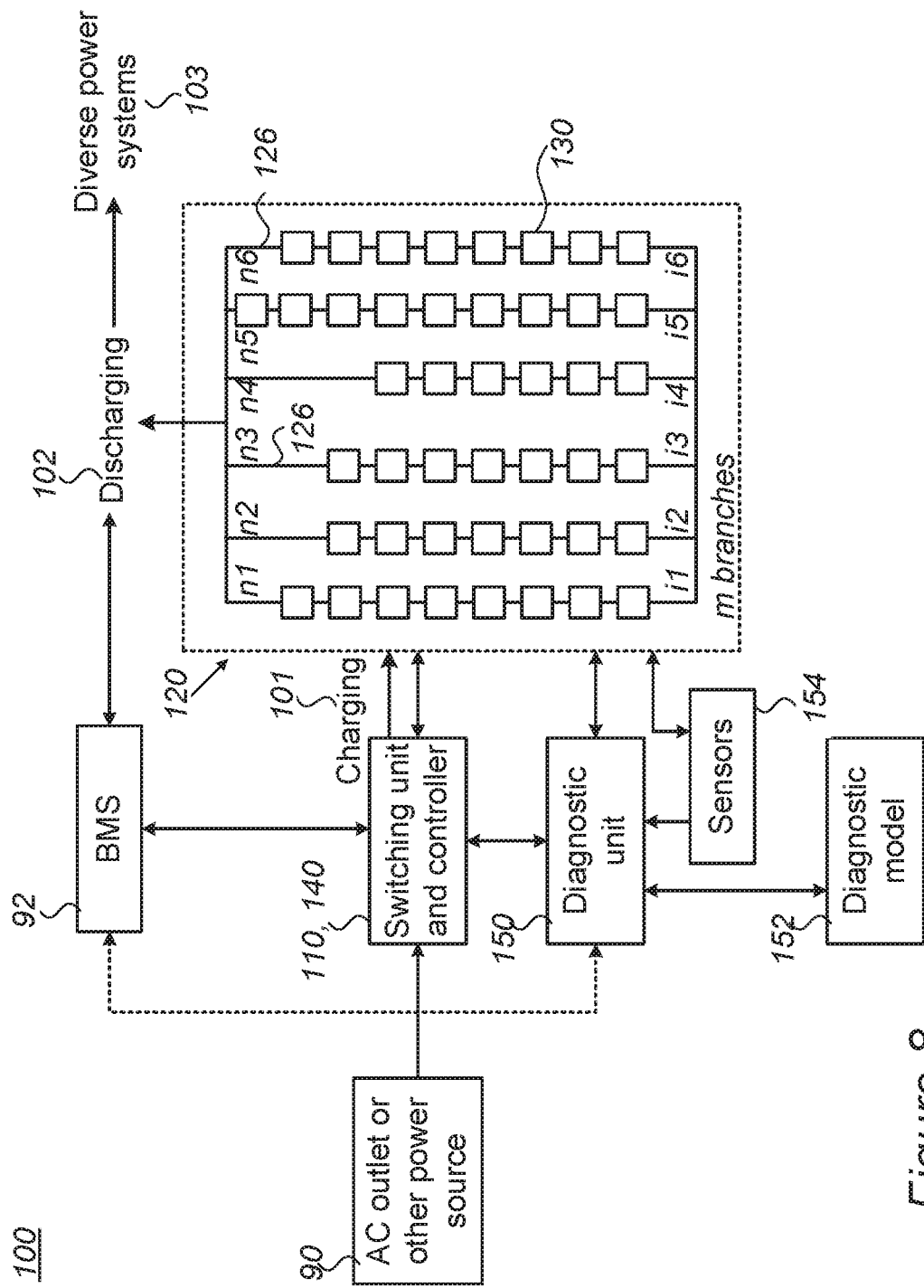
FIG. 8 is a high-level schematic illustration of systems with a diagnostic unit, according to some embodiments of the invention.

FIG. 8 is a high-level schematic illustration of system 100 with a diagnostic unit 150, according to some embodiments of the invention. Diagnostic unit 150 may be associated, and/or in communication with controller 140 and possibly with switching unit 110, as well as with plurality 120 of battery cells 130, and may be implemented in any of systems 100 disclosed above. Diagnostic unit 150 may be configured to evaluate cells 130 by deriving at least one cell parameter therefor, and providing adjustments to the connection scheme and/or to charged assembly 125, to increase a cycling lifetime of system 100. It is noted that systems 100 may be configured to use any of AC source 90, electric vehicles, photovoltaic systems, solar systems, grid-scale battery energy storage systems or any other power system for charging the cells, and discharging 102 may be carried out to any of a diverse range of power systems 103 such as any of electric vehicles, photovoltaic systems, solar systems, grid-scale battery energy storage systems or any other power consumer.

For example, diagnostic unit 150 may be configured to indicate required shuffling and/or re-arrangement of cells 130, as illustrated e.g., in FIGS. 2A-5A and explained above, and/or to indicate cell replacement and/or branch rearrangement with respect to deteriorated cells 130A, as illustrated e.g., in FIGS. 7A and 7B and explained above. In certain embodiments, diagnostic unit 150 may be configured to identify changes in cell parameter(s) such as SoC or SoH as they start to take effect, and rearrange or modify the operation parameters of cells 130 with identified changes to prevent further deterioration of these cells 130 and/or the effect of their deterioration on system 100 as a whole. For example, additional cells 130 may be used to reduce the load on cells 130 with identified changes, and/or such cells may be moved to branches 126 with lower loads, to increase their cycling lifetime.

In certain embodiments, diagnostic unit 150 may be associated with a diagnostic model 152, illustrated schematically, that may be configured to extrapolate changes in cell parameters from initial changes in cell parameters detected by diagnostic unit 150. For example, diagnostic model 152 may be statistical, simulation-based, empirical and/or updated in an on-going manner, with respect to cells 130 in system 100, other systems using similar cells, lab cell tests etc.

In certain embodiments, diagnostic unit 150 may be configured to identify defunct cells 130A (see, e.g., FIGS. 7A and 7B) and provide corresponding data for managing defunct cells 130A and/or parts of whole of array 120 of cells 130, e.g., with respect to the serial/parallel connectivity of cells 130 in array 120 and/or in charged assembly 125. Diagnostic unit 150 may be configured to identify defunct cells 130A in a range of ways, using a range of parameters, as exemplified in the following non-limiting examples. In certain embodiments, defunct cells 130A may be identified by real time measurements taken, e.g., by sensors 154 configured to sense at least one parameter of cells 130 (e.g., temperature, maximal voltage, or more complex parameters such as SoH, rate of charging or discharging etc.). In certain embodiments, defunct cells 130A may be identified by data gathered by other system components, such as controller 140 and/or BMS 92, e.g., data concerning cell parameters that is collected during the operation (e.g., charging 101, discharging 102 and cell shuffling, see, e.g., FIG. 3) of array 120. The gathered data may be analyzed by diagnostic unit 150 statistically and/or using models such as diagnostic model 152. The definition of defunct cells 130A may be modified during operation of system 100, e.g., to decrease of increase parameter thresholds for identifying cells 130 as being defunct. Changing the thresholds may be carried out with respect to global performance requirements such as overall required lifetime and load. Diagnostic unit 150 may be further configured to derive modifications of switching plans executed by switching unit 110, e.g., to prolong the battery pack cycle life while keeping the performance as high as possible. It is noted that defunct cells 130A are used to refer to any of single defunct cells, groups of defunct cells and/or defunct modules or modules of defunct cells.

Figure 9:
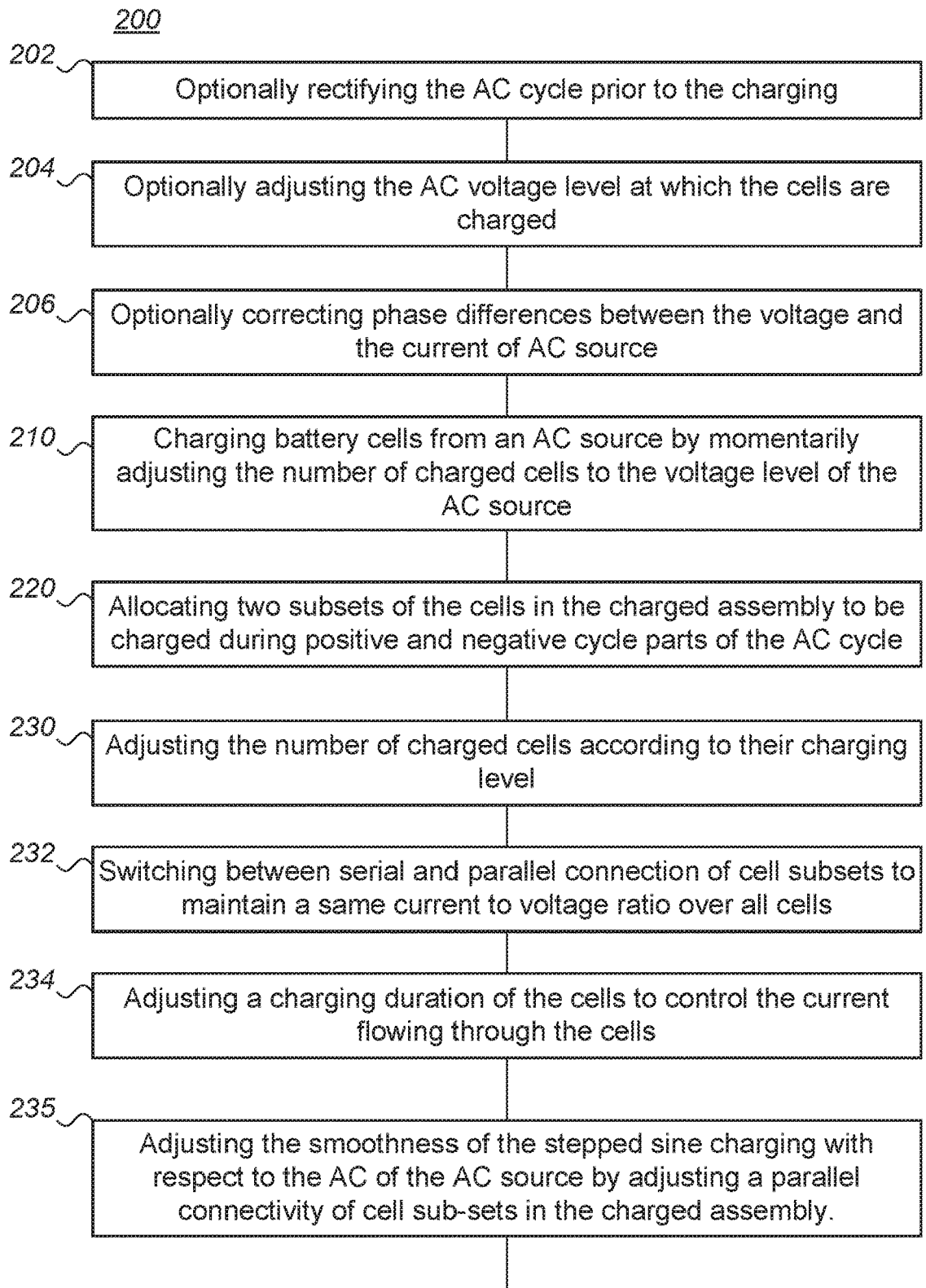
FIG. 9 is a high-level flowchart illustrating a method, according to some embodiments of the invention.

FIG. 9 is a high-level flowchart illustrating a method 200, according to some embodiments of the invention. The method stages may be carried out with respect to system 100 described above, which may optionally be configured to implement method 200. Method 200 may be at least partially implemented by at least one computer processor, e.g., in a controller such as controller 140. Certain embodiments comprise computer program products comprising a computer readable storage medium having computer readable program embodied therewith and configured to carry out the relevant stages of method 200. Method 200 may comprise the following stages, irrespective of their order. Methods 200 may comprise charging cell arrays using various sources, such as AC source 90 and/or any of electric vehicles, photovoltaic systems, solar systems, grid-scale battery energy storage systems or any other power system delivering AC power. Methods 200 may further be configured to deliver energy by discharging the cells to any power source, e.g., any of electric vehicles, photovoltaic systems, solar systems and grid-scale battery energy storage systems.

Method 200 comprises charging a plurality of battery cells, each chargeable at a voltage v, from an AC source that supplies an AC voltage level V at an AC cycle, by momentarily adjusting a number n of charged cells in a charged assembly of the battery cells (stage 210), e.g., wherein each time $V \geq nv$, another, $(n+1)^{th}$, cell is added to the charged assembly, and each time $V \leq (n-1)v$, one, $n^{th}$, of the cells is removed from the charged assembly.

Method 200 may further comprise allocating two subsets of the cells in the charged assembly to be charged during a positive and a negative cycle part of the AC cycle, respectively (stage 220).

In certain embodiments, method 200 may comprise rectifying the AC cycle prior to the charging (stage 202) and/or transforming the AC cycle prior to the charging (stage 204) to adjust the AC voltage level V at which the plurality of battery cells are charged. In various embodiments, method 200 may comprise correcting phase differences which may occur between charging voltage and current of AC source (stage 206).

Method 200 may further comprise carrying out the adjusting of the number n of charged cells according to a level of charging thereof (stage 230). In some embodiments, method 200 may further comprise switching between serial and parallel connection of cell subsets to maintain a same current to voltage, i/v ratio over all cells (stage 232). In certain embodiments, method 200 may comprise adjusting a charging duration of the cells to control the current i flowing through the cells (stage 234).

In certain embodiments, method 200 may further comprise adjusting the smoothness of the stepped sine charging with respect to the AC of the AC source by adjusting a parallel connectivity of cell sub-sets in the charged assembly (stage 235).

In certain embodiments, method 200 may further comprise adjusting peak currents of the supplied AC (stage 236) and/or adjusting the number of branches and/or the number of cells in each branch in the charged assembly (stage 238), e.g., in cases of a phase difference between the supplied current and voltage, as well as optionally temporarily switching terminals of some of the cells and/or branches (stage 239), e.g., to accommodate for periods during the AC cycles of opposite polarities of the current and voltage, in order to maximize the utilization of the supplied power. Any of stages 230-239 may be applied and/or configured to accommodate for current-voltage relations of the AC source.

In certain embodiments, method 200 comprises arranging a plurality of battery cells in a charged assembly comprising a plurality of parallel-connected branches, each having serially connected cells, wherein cell groups in the charged assembly, each comprising at least one cell, are switchable within and/or between the branches (stage 240), charging the charged assembly from an AC source that supplies an AC voltage level at an AC cycle, by momentarily adjusting the cell groups that are being charged in the charged assembly—according to voltage and/or current levels that are momentarily supplied by the AC source (stage 245), and continuously rearranging the charged cell groups to equalize at least one cell parameter among the cells which comprises at least a state of charge (SoC) or a state of health (SoH) or related parameters (stage 250).

In certain embodiments, method 200 may further comprise configuring the charging of each cell group to be carried out under constant current and/or under constant voltage conditions (stage 252). Method 200 may further comprise shuffling cells between different cell groups to equalize the at least one cell parameter among the cells (stage 255) and/or shuffling the cells during consecutive AC cycles to maintain a same level of charging over all the cells (stage 258), and optionally carrying out the shuffling cyclically with respect to a specified cell order (stage 259).

In some embodiments, method 200 may comprise configuring the cell groups to handle at least one of: different sections of the AC cycle, different phases of the AC source supply, sections of the AC cycle with different voltage to current ratios due to phase shifts and/or different SoC of the cells (stage 260).

Method 200 may further comprise identifying defunct cells using a charging capacity thereof, and removing branches of defunct cells from the charged assembly to maintain a rated application voltage of the charged assembly (stage 270). In certain embodiments, method 200 may comprise identifying defunct cells by monitoring the momentary overall voltage of the charging cells (stage 272), and optionally replacing identified defunct cells and adjusting the charging with respect to a state of charge of the replacing cells (stage 274).

In some embodiments, method 200 may further comprise at least partly rectifying the AC cycle and optionally transforming the supplied AC voltage level (stage 280).

In certain embodiments, discharging the battery cells may be carried out by momentarily adjusting the number of the discharged cells to the required AC voltage level (stage 290), according to similar stages as described above. Alternatively or complementarily, prior art discharging methods may be used such as via an inverter, and/or DC may be discharged directly from corresponding cells.

In some embodiments, method 200 may further comprise evaluating the cells by deriving at least one cell parameter therefor, and providing switching adjustments to the charged assembly, to increase a cycling lifetime of the system (stage 300).

In any of the disclosed embodiments, at least some of cells 130 may be fast charging cells, which may be charged at rates higher than 5 C, e.g., 10 C, 30 C or 100 C (with C denoting the rate of charging and/or discharging of cell/battery capacity, e.g., 10 C denotes charging and/or discharging the full cell capacity in $\frac{1}{10}$ of an hour). Fast charging cells may comprise rechargeable Li-ion cells having anode material based on metalloids such as Si, Ge and/or Sn, as taught e.g., by any of U.S. Pat. Nos. 9,472,804 and 10,096,859, and U.S. patent application Ser. Nos. 15/480,888, 15/414,655 and 15/844,689, which are incorporated herein by reference in their entirety.

Advantageously, disclosed charging systems 100 and methods 200 reduce the losses in the charging process to nearly zero, and provide the possibility to manage the cells individually—to optimize their lifetime and the power use and delivery efficiency of the stack of all cells.

Elements from FIGS. 1A-9 may be combined in any operable combination, and the illustration of certain elements in certain figures and not in others merely serves an explanatory purpose and is non-limiting. Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of charging a plurality of battery cells, the method comprising:
    providing a plurality of battery cells, each chargeable at a voltage v;
    providing an alternating current (AC) source that supplies an AC voltage level V at an AC cycle directly to the plurality of battery cells; and
    momentarily adjusting a number n of battery cells constituting a charged assembly of the plurality of battery cells,
    wherein each time $V \geq nv$, another, $(n+1)^{th}$, cell is added to the charged assembly, and each time $V \leq (n-1)v$, one, $n^{th}$, cell is removed from the charged assembly, to accommodate an overall voltage level of the charged assembly (nv) to a momentary voltage level of the AC supply (V).

2. The method of claim 1, further comprising allocating two subsets of the cells in the charged assembly to be charged during a positive and a negative cycle part of the AC cycle, respectively.

3. The method of claim 1, wherein the AC source provides multi-phase power and the method further comprises allocating corresponding multiple subsets of the cells in the charged assembly to be charged from respective phases of the AC cycle.

4. The method of claim 1, further comprising at least partly rectifying the AC cycle prior to the charging.

5. The method of claim 1, further comprising transforming the AC cycle prior to the charging to adjust the AC voltage level V at which the plurality of battery cells is charged.

6. The method of claim 1, further comprising correcting phase differences between voltage and current of the AC source.

7. The method of claim 1, further comprising carrying out the adjusting of the number n of charged cells according to a level of charging thereof.

8. The method of claim 1, further comprising switching between serial and parallel connection of cell subsets to maintain a same current to voltage, i/v ratio over all cells.

9. The method of claim 1, further comprising adjusting a smoothness of the charging with respect to the AC of the AC source by adjusting a parallel connectivity of cell sub-sets in the charged assembly.

10. The method of claim 1, further comprising shuffling the cells during consecutive AC cycles to maintain a same level of charging over all the cells.

11. The method of claim 1, further comprising at least one of:
    adjusting peak currents of the supplied AC,
    adjusting a number of branches and/or a number of cells in each branch in the charged assembly, and
    temporarily switching terminals of some of the cells,
    to accommodate for current-voltage relations of the AC source.

12. A method of charging battery cells, the method comprising:
    arranging a plurality of battery cells in a charged assembly, the charged assembly comprising a plurality of parallel-connected branches, each branch having serially connected cells, wherein cell groups in the charged assembly each comprise at least one cell, and each cell group is switchable within and/or between the branches,
    charging the charged assembly directly from an alternating current (AC) source that supplies an AC voltage level at an AC cycle, by momentarily adjusting the cell groups that are being charged in the charged assembly according to voltage and/or current levels that are momentarily supplied by the AC source, to accommodate the former to the latter, and
    continuously adding and subtracting cells to and from the cell groups that are being charged to equalize at least one cell parameter among the cells selected from a state of charge (SoC), a state of health (SoH) and related parameters.

13. The method of claim 12, further comprising configuring the charging of each cell group to be carried out under constant current and/or under constant voltage conditions.

14. The method of claim 12, further comprising shuffling cells between different cell groups to equalize the at least one cell parameter among the cells.

15. The method of claim 12, further comprising identifying defunct cells using a charging capacity thereof, and removing branches of defunct cells from the charged assembly to maintain a rated application voltage of the charged assembly.

16. The method of claim 12, further comprising configuring the cell groups to handle at least one of: different sections of the AC cycle, different phases of the AC source supply, sections of the AC cycle with different voltage to current ratios due to phase shifts and/or different SoC of the cells.

17. The method of claim 12, further comprising at least partly rectifying the AC cycle and optionally transforming the supplied AC voltage level.

18. The method of claim 12, further comprising discharging the battery cells by momentarily adjusting a number of the discharged cells to a required AC voltage level.

19. The method of claim 12, further comprising evaluating the cells by deriving at least one cell parameter therefor, and providing switching adjustments to the charged assembly, to increase a cycling lifetime of the system.

20. A system for charging battery cells comprising:

a plurality of battery cells, each chargeable at a voltage v, an alternating current (AC) source that supplies an AC voltage level V at an AC cycle, a switching unit configured to modify a connection scheme of the battery cells to define a charged assembly of the battery cells that is charged directly from the AC source, and a controller configured to control the switching unit, to momentarily adjust a number n of charged cells in the charged assembly, wherein each time $V \geq nv$, another, $(n-1)^{th}$, cell is added to the charged assembly, and each time $V \leq (n-1)v$, one, nth cell is removed from the charged assembly, to accommodate an overall voltage level of the charged assembly (nv) to a momentary voltage level of the AC supply (V) and charge the charged assembly directly from the AC source.

21. The system of claim 20, further comprising a rectifier and/or a transformer, configured to respectively rectify and/or to transform the AC cycle prior to the charging, and optionally further comprising one or more phase correction circuits configured to correct phase differences between charging voltage and current of the AC source.

22. The system of claim 20, wherein the controller and the switching unit are further configured to adjust the number n of charged cells with respect to at least one of:

a sign of the AC cycle, allocating different sub-sets of cells from the charged assembly to be charged during a positive and a negative cycle part of the AC cycle, respectively;

a level of charging of the cells, maintaining a same level of charging of the cells; and a supplied current to voltage ratio of the cells due to a phase shifted AC source, to maintain an effective charging of the cells.

23. The system of claim 20, wherein:

the switching unit is further configured to switch between serial and parallel connection of cell subsets and wherein the charged assembly comprises a plurality of branches, each with a serially connected sub-set of the cells, and the controller and/or the switching unit are further configured to adjust a number and/or a polarity of the branches and/or the cells in each branch in the charged assembly to accommodate for current-voltage relations of the AC source and/or to smoothen the charging.

24. The system of claim 20, further comprising at least one diagnostic unit, in communication at least with the controller, and configured to evaluate the cells by deriving at least one cell parameter therefor, and providing adjustments to the connection scheme and/or to the charged assembly, to increase a cycling lifetime of the system.

* * * * *